(12) United States Patent
Ferrer Medina

(10) Patent No.: US 12,439,552 B2
(45) Date of Patent: Oct. 7, 2025

(54) COOLING MODULE FOR A CIRCUIT MODULE HAVING A PLURALITY OF CHIPSETS

(71) Applicant: HEWLETT PACKARD ENTERPRISE DEVELOPMENT LP, Houston, TX (US)

(72) Inventor: Ernesto Ferrer Medina, Aguadilla, PR (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 283 days.

(21) Appl. No.: 17/814,453

(22) Filed: Jul. 22, 2022

(65) Prior Publication Data

US 2024/0032242 A1   Jan. 25, 2024

(51) Int. Cl.
*H05K 7/20* (2006.01)
*H05K 1/02* (2006.01)

(52) U.S. Cl.
CPC ....... *H05K 7/20272* (2013.01); *H05K 1/0203* (2013.01)

(58) Field of Classification Search
CPC ............... H01L 23/473; H01L 2924/00; H01L 21/4882; H01L 23/367; H01L 23/4735; H01L 2225/06589; H01L 23/46; H01L 2023/405; H01L 21/4871; H05K 7/20254; H05K 7/20272; H05K 1/0203; H05K 7/20509; H05K 7/20927; H05K 7/20263; H05K 7/20154; H05K 7/20327; H05K 7/20936; H05K 7/20763; G06F 1/20; G06F 2200/201

(Continued)

(56) References Cited

U.S. PATENT DOCUMENTS 5,099,311 A    3/1992  Bonde et al.
7,672,129 B1 *  3/2010  Ouyang ................ H01L 23/473
                                                  174/15.1

(Continued)

OTHER PUBLICATIONS

Ramakrishnan, B. et al., "Experimental Investigation of Direct Liquid Cooling of a Two-Die Package", IEEE 34th SEMI-THERM Symposium, Mar. 2018, 8 pages.

(Continued)

*Primary Examiner* — Mandeep S Buttar
(74) *Attorney, Agent, or Firm* — Hewlett Packard Enterprise Patent Department

(57) ABSTRACT

Example implementations relate to a cooling module, a circuit assembly having one or more circuit modules and the cooling module, and a method of forming the cooling module. The cooling module includes a first cooling component and a second cooling component disposed on the first cooling component. The first cooling component includes a plurality of microchannel blocks thermally coupled to a plurality of chipsets of the circuit module. The second cooling component includes an inlet port, an outlet port, and a plurality of distribution conduits fluidically coupled to the inlet port and outlet port. Each distribution conduit is disposed on one or more microchannel blocks of the plurality of microchannel blocks and directs coolant from the inlet port to the outlet port through the one or more microchannel blocks to absorb waste heat transferred to the one or more microchannel blocks from at least chipset of the plurality of chipsets.

15 Claims, 13 Drawing Sheets

(58) Field of Classification Search
USPC .......................................................... 361/699
See application file for complete search history.

(56) References Cited

U.S. PATENT DOCUMENTS

| | | | | |
|---|---|---|---|---|
| 7,948,077 | B2 | 5/2011 | Andry et al. | |
| 2004/0112571 | A1* | 6/2004 | Kenny | F28D 15/00 |
| | | | | 165/905 |
| 2004/0112585 | A1* | 6/2004 | Goodson | F04B 19/006 |
| | | | | 165/80.4 |
| 2005/0133212 | A1* | 6/2005 | Wilson | F28F 3/025 |
| | | | | 257/E23.098 |
| 2006/0108098 | A1* | 5/2006 | Stevanovic | H01L 23/473 |
| | | | | 257/E23.098 |
| 2007/0227708 | A1* | 10/2007 | Hom | H01L 23/473 |
| | | | | 165/300 |
| 2018/0145009 | A1* | 5/2018 | Fukuoka | H01L 23/49827 |
| 2020/0105643 | A1* | 4/2020 | Wan | H01L 25/18 |
| 2022/0210953 | A1* | 6/2022 | Gao | H05K 7/20254 |
| 2023/0152047 | A1* | 5/2023 | Zhou | H05K 7/20254 |
| | | | | 165/104.19 |

OTHER PUBLICATIONS

Yu, H. et al., "Design and Analysis of Microchannel for the Thermal Management of Multi-stacked LTCC Laminates," Aug. 2018, IEEE 19th Int'l Conference on Electronic Packaging Technology, 4 pages.

* cited by examiner

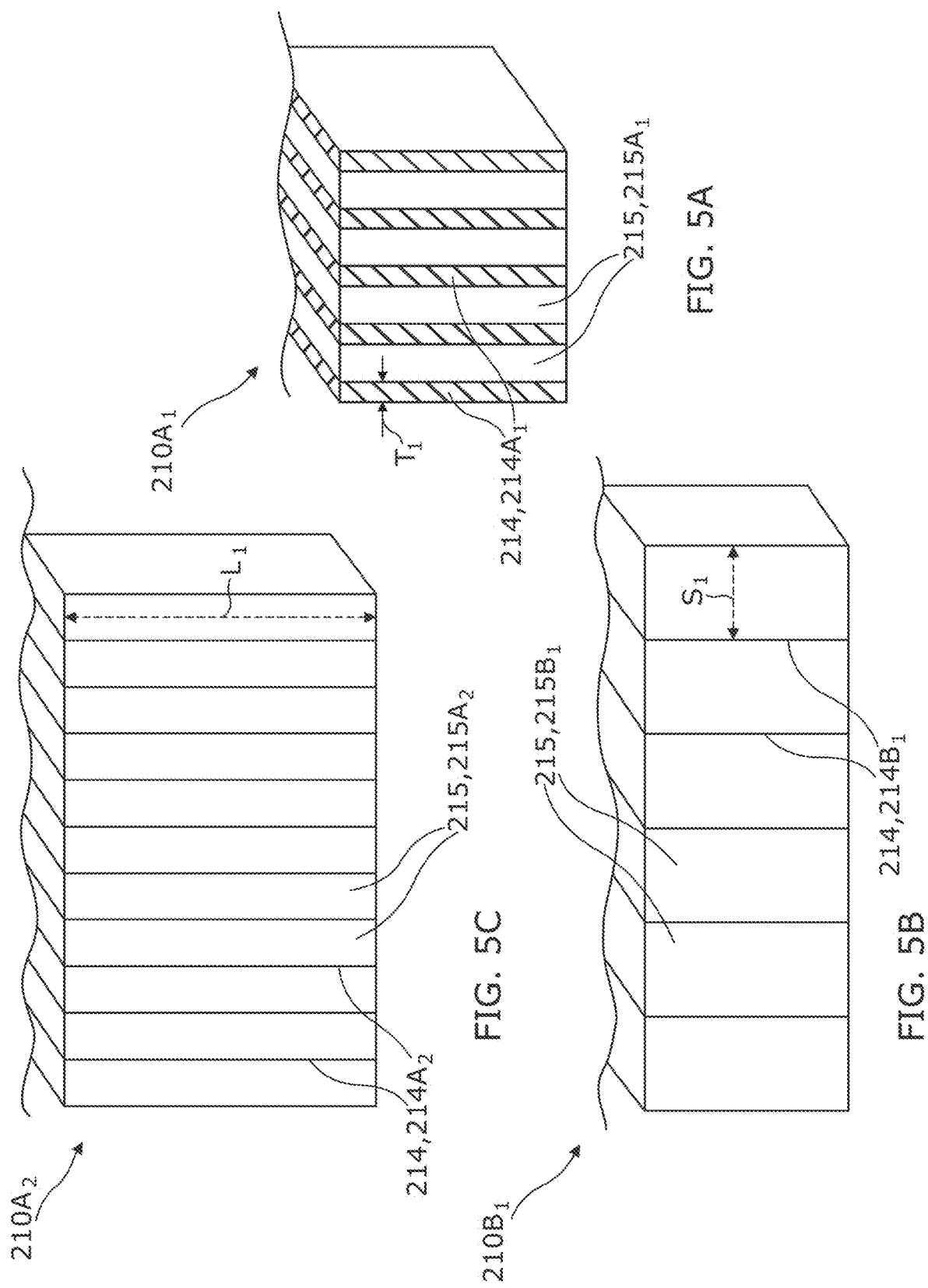

COOLING MODULE FOR A CIRCUIT MODULE HAVING A PLURALITY OF CHIPSETS

BACKGROUND

An electronic device, such as a computer, a networking device, etc., may include a circuit module, such as a multichip module having a substrate with one or more chips (e.g., central processing units (CPUs), graphics processing units (GPUs), power supply chips, memory chips, etc.) mounted on the substrate. The chips and/or the substrate may generate waste heat during their operation. In order to minimize adverse effects of such waste heat on the circuit module, the electronic device may include a thermal management system to draw the waste heat away from the chips of the circuit module.

BRIEF DESCRIPTION OF THE DRAWINGS

Various examples will be described below with reference to the following figures.

FIG. 5A illustrates a perspective view of a portion of one microchannel block according to an example implementation of the present disclosure.

FIG. 5B illustrates a perspective view of a portion of another microchannel block according to an example implementation of the present disclosure.

FIG. 5C illustrates a perspective view of a portion of yet another microchannel block according to an example implementation of the present disclosure.

DETAILED DESCRIPTION

Figure 1:
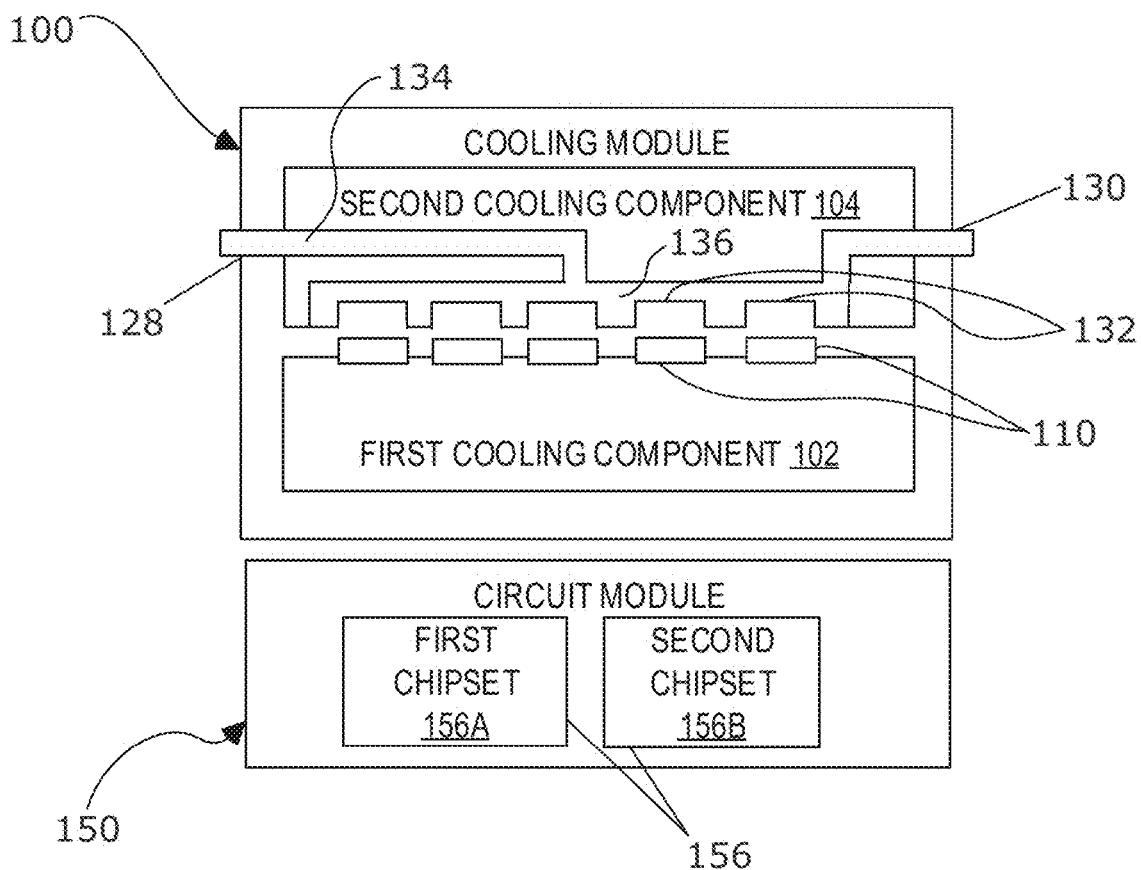
FIG. 1 illustrates a block diagram of a cooling module disposed on a circuit module according to an example implementation of the present disclosure.

The following detailed description refers to the accompanying drawings. For purposes of explanation, certain examples are described with reference to the components illustrated in FIGS. 1-8. The functionality of the illustrated components may overlap, however, and may be present in a fewer or greater number of elements and components. Moreover, the disclosed examples may be implemented in various environments and are not limited to the illustrated examples. Further, the sequence of operations described in connection with FIG. 8 is an example and is not intended to be limiting. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As used herein, "circuit module" refers to an electronic module having a substrate and a plurality of chipsets mounted on the substrate. As used herein, "circuit assembly" refers to an electronic circuit having a printed circuit board, one or more circuit modules, and one or more electronic components. The one or more electronic components, may include, but is not limited to, capacitors, resistors, or the like. The one or more circuit modules and the one or more electronic components may be removably coupled to the printed circuit board via solder array. The term "cold plate" is sometimes used in the art with varying meanings, with some meanings being more generic and others being more specific. As used herein "cold plate" refers to a device that receives heat from a solid body via conduction (contact) and dissipates that heat into a liquid coolant of a liquid coolant loop. As used herein, "coolant" refers to a type of fluid (e.g., water), which is used to cool a cooling component (e.g., cold plate) by absorbing waste heat from a heat source such as circuit module or the cooling component thermally coupled to the circuit module. The coolant may be either in a liquid phase or a gaseous phase or combinations thereof. As used herein "fluidically coupled" refers to two or more components coupled in an appropriate manner such that a fluid or a least a portion of a fluid can directly or indirectly pass or flow from one component to another component. As used herein "removably coupled" refers to a component, which may be detachably connected to another component.

Further, as used herein, to "thermally couple" two objects means to provide a thermally conductive pathway between the objects that allows waste heat to be conducted between the objects. Two objects may be considered to be thermally coupled if any of the following are true: (1) the two objects are in contact with one another (either direct contact, or contact via a thermal interface material), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 5 W·m$^{-2}$·K$^{-1}$ or greater. An object, device, or assembly (which may include multiple distinct bodies that are thermally coupled, and may include multiple different materials), is "thermally conductive" between two thermal interfaces if any of the following is true: (1) a heat transfer coefficient between the thermal interfaces is above 5 W·m$^{-2}$·K$^{-1}$ or greater at any temperature between 0° C. and 100° C., (2) the object is a continuous piece of material has a thermal conductivity (often denoted k, λ, or κ) between the two interfaces between 1 W·m$^{-1}$·K$^{-1}$ or greater at any temperature between 0° C. and 100° C., or (3) the object is a heat pipe, vapor chamber, body of copper, or body of aluminum. Examples of materials whose thermal conductivity is greater than 1 W·m$^{-1}$·K$^{-1}$ between 0° C. and 100° C. include almost all metals and their alloys (e.g., copper, aluminum, gold, etc.), some plastics (e.g., TECACOMP® TC compounds, CoolPoly® D-series Thermally Conductive Plastics), and many other materials.

An electronic device, such as a computer (e.g., server, storage device, etc.), networking device (wireless access point, router, switch, etc.), or the like, may include one or more circuit assemblies. Each circuit assembly may include one or more circuit modules, and each circuit module may include a substrate and multiple chipsets disposed on the substrate. Each of the multiple chipsets may include a first chip and a plurality of second chips disposed partially surrounding the first chip. The first chip may include, but is not limited to, a CPU, a GPU, or the like. Each of the plurality of second chips may include, but is not limited to, a power supply chip, a memory chip, or the like. During operation of the circuit assembly, one or more chips in each chipset of the circuit module may generate waste heat. Such waste heat is undesirable because it may negatively impact the operation of the circuit assembly. For example, the waste heat may cause physical damage to the one or more chips, degrade performance, reliability, or life expectancy of the circuit module, and in some cases the waste heat may even cause failure of the circuit assembly.

In order to minimize the adverse effects of waste heat in a circuit module having multiple chipsets, a lid, which is generally disposed over the multiple chipsets, may be removed. Generally, the lid is used to provide physical protection to the underlying chipsets. The removal of the lid may reduce thermal resistance of each of the multiple chipsets by several degrees Celsius, by allowing waste heat from each of the multiple chipsets to be dissipated to an ambient environment without a physical barrier between the chipsets and the ambient environment. However, dealing with such bare (i.e., uncovered) chipsets are precarious and may result in damaged chips, e.g., cracked chips, when the chips are improperly handled at a factory during their manufacture and/or at a deployed location after their manufacture.

To overcome such issues of waste heat in circuit modules without requiring bare chipsets, some electronic devices include a thermal management system having a cold plate and a coolant distribution unit (CDU). The cold plate may be disposed on (i.e., cover) the bare chipsets and establish a thermal interface between the cold plate and the multiple chipsets to conduct the waste heat from the chipsets. The CDU may direct a flow of coolant (e.g., water) to the cold plate to dissipate the waste heat from the cold plate into the flow of coolant. For example, the CDU may direct the coolant to the cold plate at an inlet port of the cold plate, and then the cold plate may direct the coolant through a single-pass internal chamber of the cold plate, and to an outlet port of the cold plate to dissipate the waste heat from the multiple chips. However, the coolant directed through such cold plate may have a low velocity, because of a high surface contact area in the single-pass internal chamber of the cold plate. Thus, the cold plate may have a reduced heat transfer co-efficient between the coolant and each chip.

To address such issues related to a low heat transfer co-efficient, a cold plate may be required to direct coolant at a high volumetric flow rate into a single-pass internal chamber. Specifically, the CDU may have to supply the coolant to the cold plate at the high volumetric flow rate. However, some CDUs may only be capable of supplying the coolant at a required volumetric flow rate to only a few number of electronic devices, for example, to 32 electronic devices. Thus, a thermal management system may need to utilize multiple CDUs to meet the volumetric flow rate requirements of multiple electronic devices in a data center, for example, 256 or more electronic devices. Accordingly, when a thermal management system requires multiple CDUs to deliver the coolant at the high volumetric flow rate to multiple electronic devices, there may be a significant increase in capital expenditure costs and/or operating costs of the data center.

Additionally, coolant supplied to a cold plate may need to have a thermal margin to allow the coolant to efficiently absorb the waste heat from multiple chips via the cold plate. As used herein, the term "thermal margin" may refer to a temperature difference between a case temperature of each chip and the temperature of the coolant that is in thermal contact with the corresponding chip. Further, as used herein, "case temperature" may refer to a maximum temperature that each chip may attain while operating to execute one or more workloads. If a circuit module is executing graphics intensive workloads, then the GPU chip may have a case temperature which is different in comparison with a case temperature of other chips, such as memory chips, which may have less intensive workloads in comparison with the GPU chips executing the graphics intensive workloads. Accordingly, in some examples, the coolant supplied from the CDU may have a sufficient thermal margin, (e.g., of about 4 degrees Celsius or more) when it flows in thermal contact over one or more upstream chips of the multiple chips. Thus, the coolant may efficiently absorb the waste heat from the one or more upstream chips of the multiple chips, i.e., generate a partially heated coolant. As used herein, "upstream chips" may refer to the chips that are positioned proximate to the inlet port of the cold plate. For example, a first chip may be construed to be "upstream" of a second chip, when the first chip and second chip are positioned in a flow path of coolant supplied to the cold plate (e.g., via the inlet port of the cold plate) such that the coolant flows in thermal contact over (i.e., is thermally coupled to) the first chip before the coolant flows in thermal contact over the second chip. However, the partially heated coolant may not have the sufficient thermal margin, as it flows in thermal contact over one or more downstream chips. As used herein, "downstream chips" may refer to the chips that are positioned proximate to the outlet port of the cold plate. For example, a first chip may be construed to be "downstream" of a second chip, when the first chip and second chip are positioned in a flow path of coolant supplied to the cold plate such that the coolant flows in thermal contact with the first chip after the coolant flows in thermal contact with the second chip. Thus, the partially heated coolant cannot efficiently absorb the waste heat from the one or more downstream chips of the multiple chips. Accordingly, the cold plate may not adequately or uniformly dissipate the waste heat away from multiple chips.

In accordance with aspects of the present disclosure, a cooling module is provided for a circuit module that mitigates one or more challenges noted hereinabove with removing heat from circuit modules. The cooling module may be disposed over the circuit module for thermal management of a plurality of chipsets of the circuit module. In some examples, the plurality of chipsets may include a first chipset and a second chipset. Each of the first chipset and the second chipset may include a first chip and a plurality of second chips disposed partially surrounding the first chip. In one or more examples, the cooling module includes a first cooling component and a second cooling component. The first cooling component includes a plurality of microchannel blocks formed on its upper surface. The second cooling component includes an inlet port, an outlet port, and a plurality of distribution conduits formed on its lower surface. Each distribution conduit is fluidically coupled to the inlet and outlet ports. The first cooling component is disposed on the circuit module such that the plurality of microchannel blocks are thermally coupled to the plurality of chipsets. Further, the second cooling component is disposed on the first cooling component such that each distribution conduit is disposed on one or more microchannel blocks and defines a flow path between the first cooling component and the second cooling component. In such examples, each distribution conduit may direct a portion of coolant (e.g., water) along a corresponding flow path from the inlet port to the outlet port via the one or more microchannel blocks.

During the operation of the electronic device, a flow of coolant received from a CDU may be bifurcated into multiple portions in the cooling module and each portion of coolant may be directed towards a respective distribution conduit of the plurality of distribution conduits. In such examples, each distribution conduit may direct the portion of coolant along a corresponding flow path. In one or more examples, each portion of coolant flowing along the corresponding flow path may pass through the one or more microchannel blocks to absorb the waste heat transferred to the one or more microchannel blocks from one or more chips of at least one chipset. In particular, each distribution conduit may direct a portion of coolant through one or more microchannel blocks that are thermally coupled to at least a portion of the first chip (e.g., the GPU or a CPU) to absorb the waste heat from the first chip and to generate a sub-portion of partially heated coolant. When a portion of coolant received from the CDU is first directed through the one or more microchannel blocks that are thermally coupled to the portion of the first chip having a high case temperature, such portion of coolant may have a sufficient thermal margin to absorb the waste heat from the first chip. Each distribution conduit may further direct a sub-portion of the partially heated coolant through the one or more microchannel blocks that are thermally coupled to one or more second chips (e.g., one or more memory chips) to absorb the waste heat from the one or more second chips and to generate a sub-portion of heated coolant. Since the sub-portion of partially heated coolant is directed through the one or more microchannel blocks that are thermally coupled to the one or more second chips having a low case temperature, the sub-portion of partially heated coolant may still have the sufficient thermal margin to subsequently absorb the waste heat from the one or more second chips. Therefore, the cooling module may be able to adequately and uniformly dissipate the waste heat away from all chips in the circuit module.

In some examples, the plurality of distribution conduits may be arranged along at least two columns, e.g., a first column and a second column. Further, each column may include at least two distribution conduits e.g., the first column has a first distribution conduit and a second distribution conduit. In some examples, the flow path defined by each distribution conduit in the first and second columns may have a serpentine profile. For example, a first flow path defined by the first distribution conduit may have an S-shaped profile and a second flow path defined by the second distribution conduit may have an inverted S-shaped profile. In some examples, the first flow path having the S-shaped profile and the second flow path having the inverted S-shaped profile may have a common head section. Since the portion of coolant is first directed to the common head section, the portion of coolant may be directed at a high flow rate to pass through the one or more microchannel bocks that are thermally coupled to the first chip. Therefore, a heat transfer co-efficient may be increased between such one or more microchannel blocks and the portion of coolant. Accordingly, the coolant may absorb an adequate amount of waste heat from the first chip (e.g., a GPU or a CPU, each of which are a high-powered chip) and generate the sub-portion of partially heated coolant. Since the sub-portion of partially heated coolant leaving the common head section splits into multiple sub-portions, the flow rate of each sub-portion of partially heated coolant is lowered as it passes through the one or more microchannel blocks that are in thermally coupled to one or more second chips (e.g., one or more memory chips, which are low-powered chips). Therefore, the heat transfer co-efficient may be decreased between such one or more microchannel blocks and each sub-portion of partially heated coolant. Since the one or more second chips generates less waste heat than the first chip, the case temperature for the one or more second chips may be low in comparison with the case temperature for the first chip. Hence each sub-portion of partially heated coolant may still be able to absorb the waste heat from the one or more second chips and still meet the case temperature requirements. Further, since each distribution conduit has the serpentine flow path, the coolant may flow at a high velocity for a low volumetric flow rate and have the high heat transfer co-efficient between the cooling module and the coolant. Since the cooling module operates at the low volumetric flow rate, a fewer number of CDUs can handle the coolant requirement of a plurality of electronic devices of a data center environment. In some examples, the volumetric flow rate may be around 0.12 gallons per minute.

In some examples, each microchannel block may include a plurality of elongated fins to form a plurality of microchannels. In such examples, at least one of a height of the plurality of elongated fins, a thickness of the plurality of elongated fins, or a spacing between fins in the plurality of elongated fins of at least one microchannel block may be varied to regulate a heat transfer rate between the chipset and the coolant via the at least one microchannel block. For example, the plurality of elongated fins of the microchannel block that is thermally coupled to the first chip may have a first height and the plurality of elongated fins of the microchannel block that is thermally coupled to the one or more second chips may have a second height. The second height may be greater than the first height. In such examples, the portion of coolant passing through the plurality of elongated fins of the microchannel block that is thermally coupled to the first chip may have a relatively less surface contact area to flow through in comparison with the plurality of elongated fins of the microchannel block that is thermally coupled to the one or more second chips. Hence, the portion of coolant may flow at a high velocity through the microchannel block that is thermally coupled to the first chip and have a greater heat transfer co-efficient. Similarly, the plurality of elongated fins of the microchannel block having a greater thickness or less spacing between the elongated fins may provide the less surface contact area for the portion of coolant to flow through the microchannel block and have a greater heat transfer co-efficient. Therefore, at least one microchannel block having such variations in at least one of the height, thickness, or spacing between the elongated fins may allow the coolant to flow at a high velocity through the at least one microchannel block and have a greater heat transfer co-efficient. In some examples, the height of each fin of the plurality of elongated fins may be in a range from about 1.5 millimeters (mm) to about 6 mm. The thickness of each fin of the plurality of elongated fins may be in a range from about 0.1 mm to about 1 mm. The spacing between fins in the plurality of elongated fins may be about 0.12 mm to about 2 mm. In some examples, the coolant may be one of a mixture of water and propylene glycol, a dielectric fluid, or a treated water.

Accordingly, the present disclosure describes example implementations of a cooling module for a circuit module, and a method of forming such a cooling module. The cooling module includes a first cooling component and a second cooling component. The first cooling component may be disposed on the circuit module and the second cooling component may be disposed on the first cooling component to form the cooling module for the circuit module. In such examples, the cooling module and the circuit module may collectively form a circuit assembly of an electronic device. The first cooling component includes a plurality of microchannel blocks thermally coupled to a plurality of chipsets of the circuit module. The second cooling component includes an inlet port, an outlet port, and a plurality of distribution conduits fluidically coupled to the inlet port and the outlet port. In such examples, each distribution conduit of the plurality of distribution conduits is disposed on one or more microchannel blocks of the plurality of microchannel blocks, and directs a flow of coolant from the inlet port to the outlet port through the one or more microchannel blocks to absorb waste heat transferred to the one or more microchannel blocks from at least one chipset of the plurality of chipsets.

Referring to Figures, FIG. 1 depicts a block diagram of a cooling module 100 disposed on a circuit module 150. The cooling module 100 includes a first cooling component 102 and a second cooling component 104 that is disposed on the first cooling component 102. In one or more examples, the first cooling component 102 and the second cooling component 104 may function as a cold plate. The circuit module 150 includes a plurality of chipsets 156 having a first chipset 156A and a second chipset 156B.

The first cooling component 102 includes a plurality of microchannel blocks 110 formed on an upper surface of the first cooling component 102. When the first cooling component 102 is disposed on the circuit module 150, the plurality of microchannel blocks 110 may be thermally coupled to the plurality of chipsets 156. The second cooling component 104 includes an inlet port 128 formed on a side wall and an outlet port 130 formed on another side wall. The second cooling component 104 further includes a plurality of distribution conduits 132, which may be disposed on one or more microchannel blocks of the plurality of microchannel blocks 110. The second cooling component 104 further includes a first channel 134 connected to the inlet port 128 and to an inlet of the plurality of distribution conduit 132, and a second channel 136 connected to the outlet port 130 and to an outlet of the plurality of distribution conduit 132. In some examples, each of the plurality of distribution conduits 132 may direct a flow of coolant from the inlet port 128 to the outlet port 130 through the one or more microchannel blocks 110 to absorb waste heat transferred to the one or more microchannel blocks 110 from at least one chipset of the plurality of chipsets 156 so as to dissipate the waste heat from the at least one chipset of the plurality of chipsets 156.

Figure 2A:
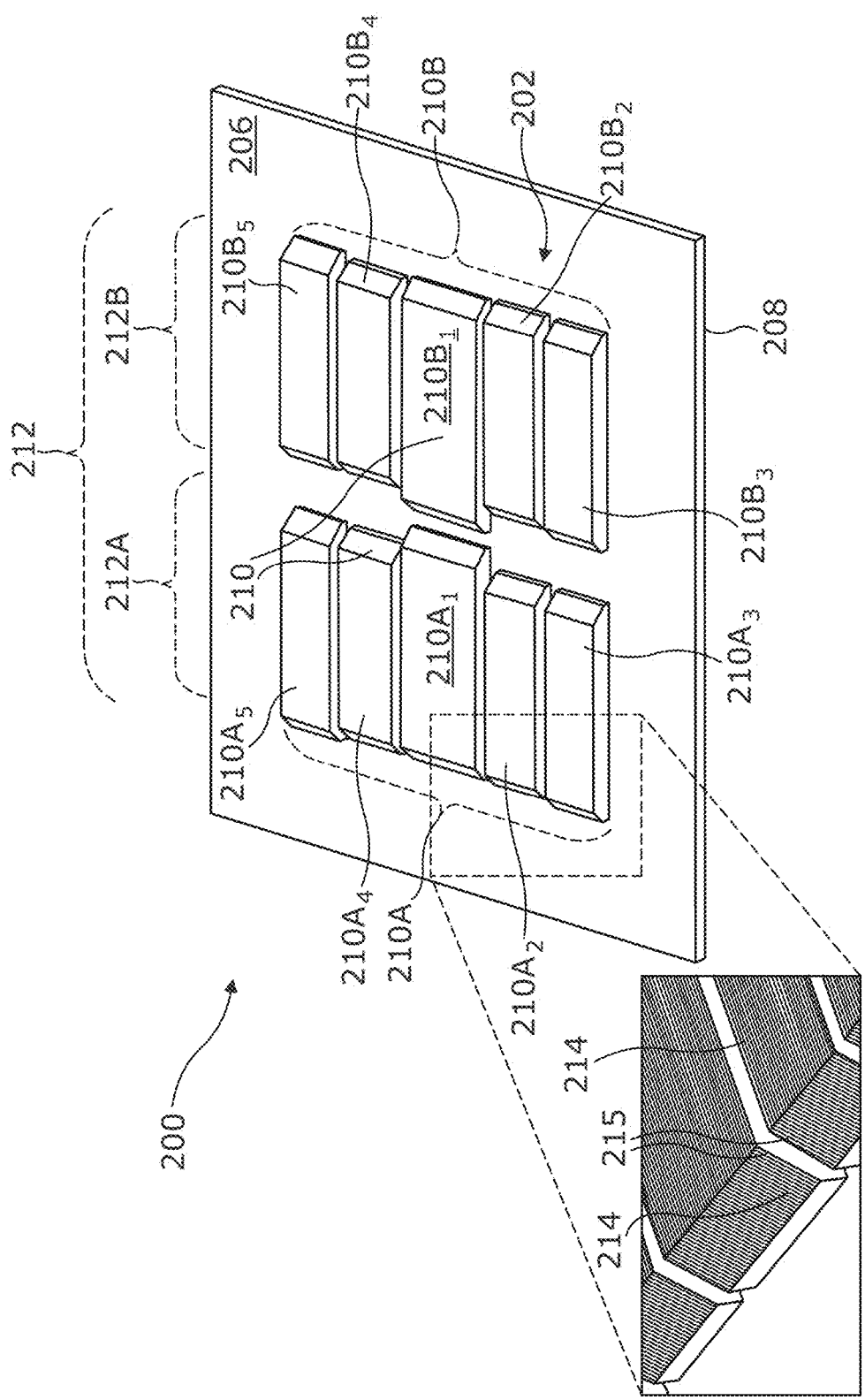
FIG. 2A illustrates a perspective top view of a first cooling component of a cooling module according to an example implementation of the present disclosure.

FIG. 2A depicts a perspective top view of a first cooling component 202 of a cooling module 200. The first cooling component 202 may be one configuration of the first cooling component 102 described above. Thus, various components of the first cooling component 202 may be similar to components of the first cooling component 102 described above. The above descriptions of components of the first cooling component 102 are applicable to the similar components of the first cooling component 202, and thus duplicative descriptions are omitted below to improve clarity. Although the first cooling component 202 may be one configuration of the first cooling component 102, the first cooling component 102 is not limited to the configuration of the first cooling component 202.

Figure 3:
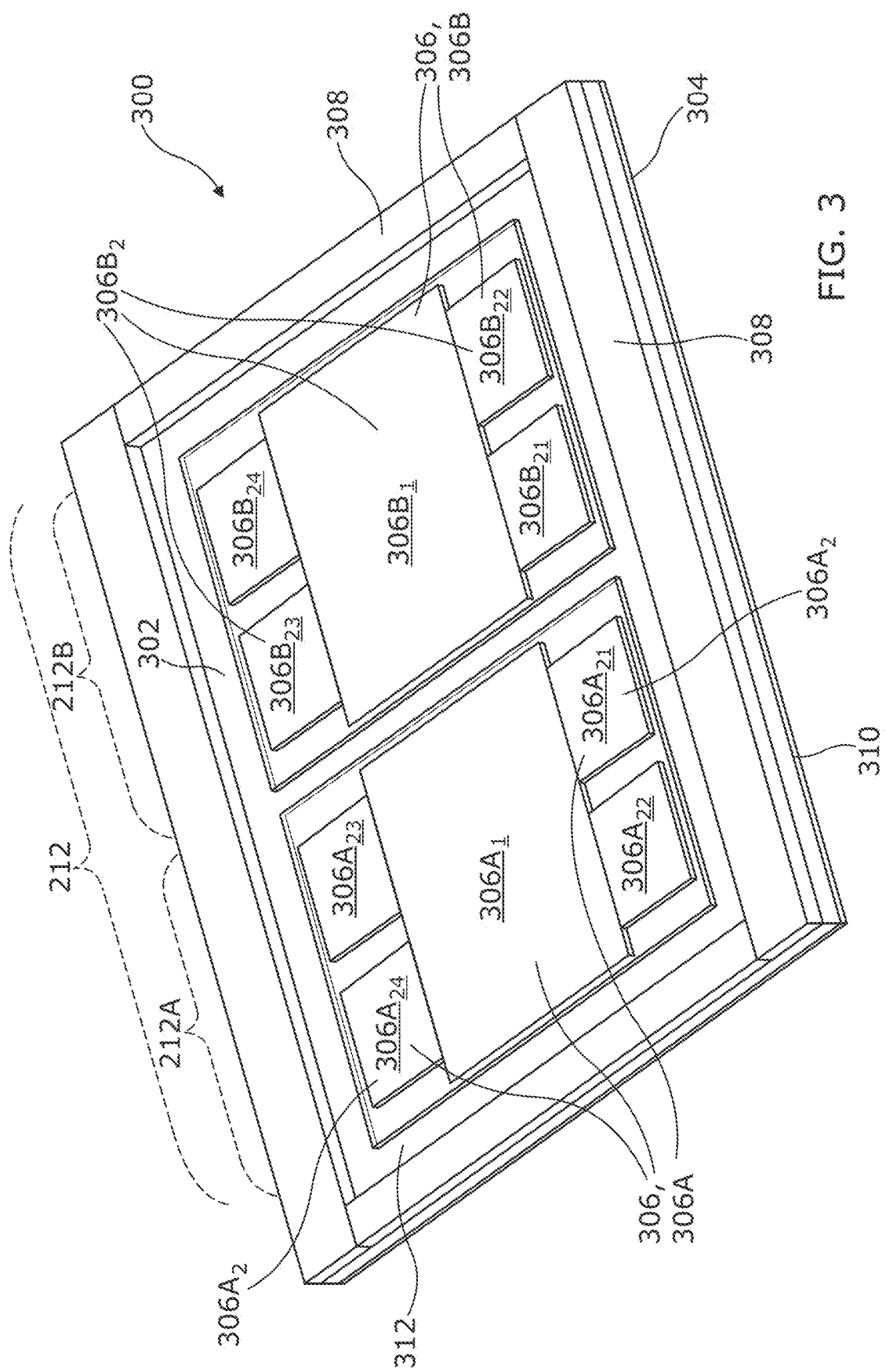
FIG. 3 illustrates a perspective view of a circuit module according to an example implementation of the present disclosure.

In the example of FIG. 2A, the first cooling component 202 is a thermally conductive component. For example, the first cooling component 202 may be formed using a thermally conductive material, such as copper, aluminum, or alloy. The first cooling component 202 may be a rectangular-shaped or square-shaped component. The shape of the first cooling component 202 may depend on the shape of a circuit module 300 (as shown in FIG. 3). In some examples, the first cooling component 202 may have a complementary shape to that of the circuit module 300. The first cooling component 202 has an upper surface 206, a lower surface 208, and the plurality of microchannel blocks 210 spaced apart from each other and formed on the upper surface 206. For example, the plurality of microchannel blocks 210 includes a first set of microchannel blocks 210A and a second set of microchannel blocks 210B that are arranged along multiple columns 212. In some examples, the first set of microchannel blocks 210A is arranged along a first column 212A and the second set of microchannel blocks 210B is arranged along a second column 212B. In the example of FIG. 2A, the first set of microchannel blocks 210A has five first microchannel blocks, e.g., $210A_1$, $210A_2$, $210A_3$, $210A_4$, and $210A_5$. Similarly, the second set of microchannel blocks 210B includes another five second microchannel blocks, e.g., $210B_1$, $210B_2$, $210B_3$, $210B_4$, and $210B_5$.

Figure 2B:
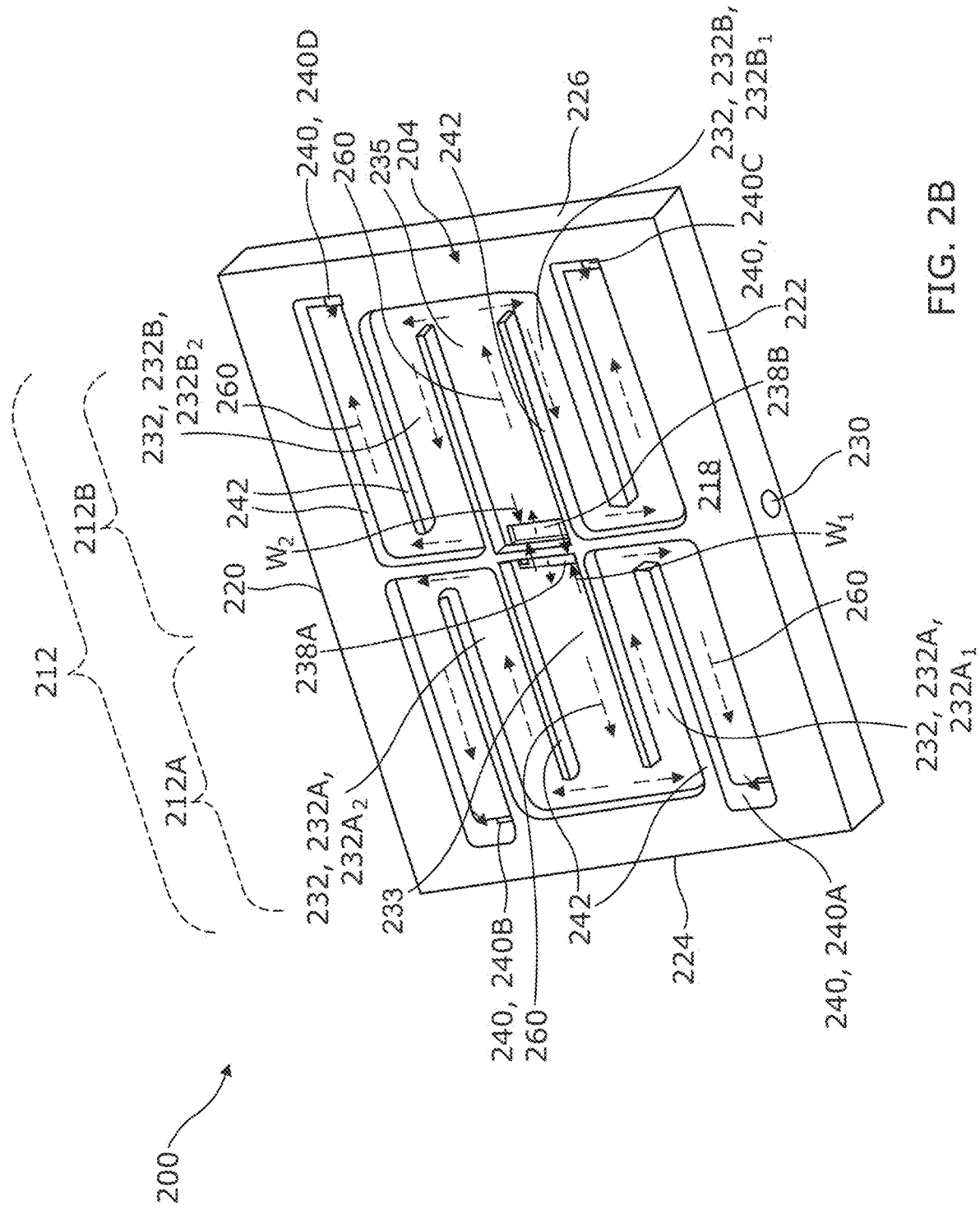
FIG. 2B illustrates a perspective bottom view of a second cooling component of the cooling module of FIG. 2A according to an example implementation of the present disclosure.
Figure 2C:
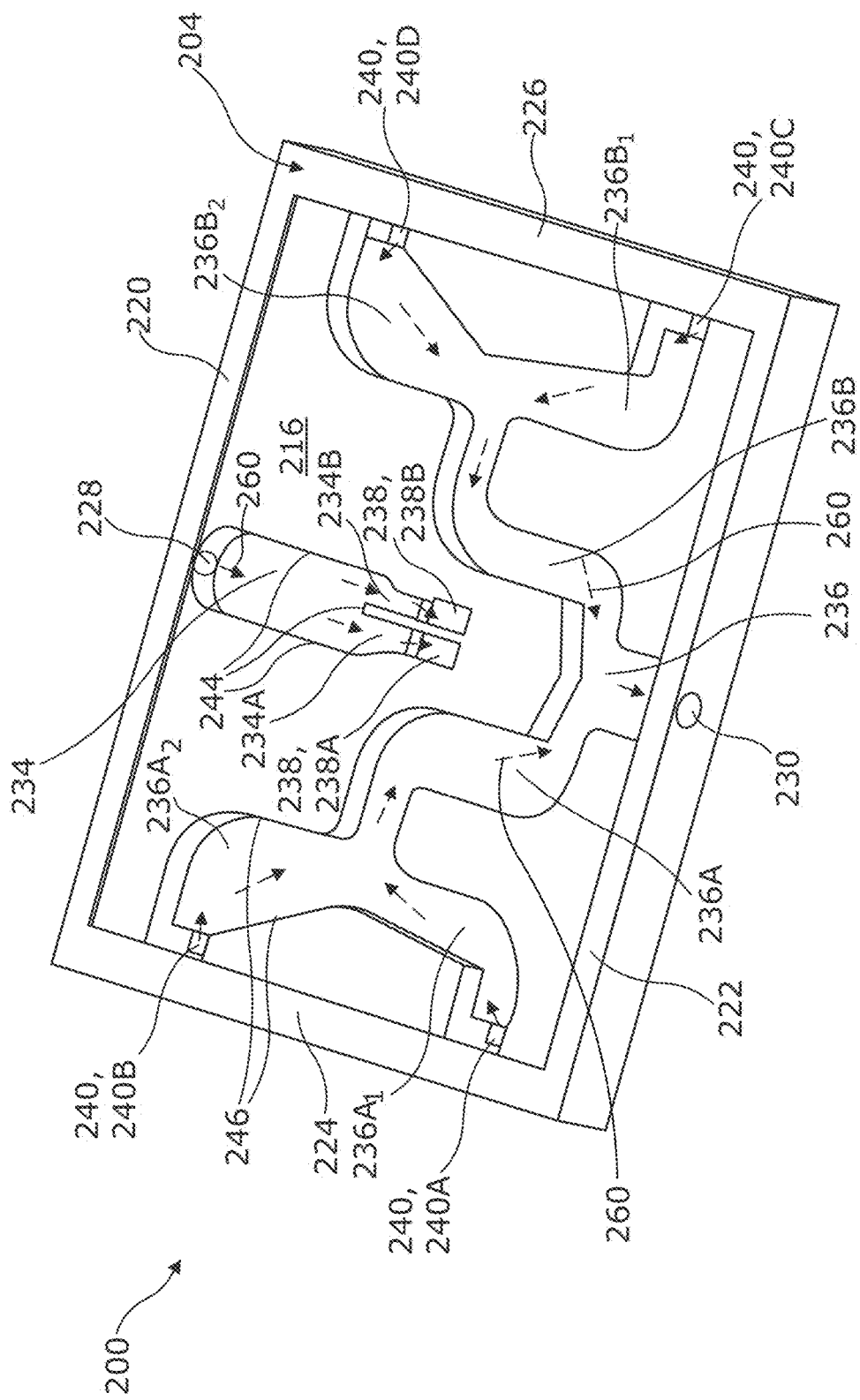
FIG. 2C illustrates a perspective top view of the second cooling component of the cooling module of FIG. 2A according to an example implementation of the present disclosure.

In one or more examples, each microchannel block of the first set of microchannel blocks 210A includes a plurality of elongated fins 214 to form a plurality of microchannels 215. The plurality of elongated fins 214 are formed on the upper surface 206 of the first cooling component 202. The plurality of microchannels 215 allow a flow of coolant 260 (as shown in FIGS. 2B-2C) from one end to another end of the respective microchannel block 210. The plurality of elongated fins 214 of one or more microchannel blocks 210 are discussed in greater details below.

FIG. 2B depicts a perspective bottom view of a second cooling component 204 of the cooling module 200. FIG. 2C depicts a perspective top view of the second cooling component 204 of the cooling module 200. In the description hereinafter, the Figures, FIGS. 2B-2C are described concurrently for ease of illustration. The second cooling component 204 may be one configuration of the second cooling component 104 described above. Thus, various components of the second cooling component 204 may be similar to components of the second cooling component 104 described above. The above descriptions of components of the second cooling component 104 are applicable to the similar components of the second cooling component 204, and thus duplicative descriptions are omitted below to improve clarity. Although the second cooling component 204 may be one configuration of the second cooling component 104, the second cooling component 104 is not limited to the configuration of the second cooling component 204.

In the example of FIGS. 2B and 2C, the second cooling component 204 is a thermally conductive component. For example, the second cooling component 204 may be formed using a thermally conductive material, such as copper, aluminum, or alloy. In one or more examples, the first cooling component 202 and the second cooling component 204 may function as a cold plate. The second cooling component 204 may be a rectangular-shaped or square-shaped component. The shape of the second cooling component 204 may depend on the shape of a first cooling component 202. Referring to FIGS. 2B-2C, the second cooling component 204 has an upper surface 216, a lower surface 218, a first side wall 220, a second side wall 222, a third side wall 224, a fourth side wall 226, an inlet port 228, an outlet port 230, a plurality of distribution conduits 232, a first channel 234, a second channel 236, a plurality of first orifices 238, and a plurality of second orifices 240.

Referring to FIG. 2C, the inlet port 228 is formed on the first side wall 220 and the outlet port 230 is formed on the second side wall 222. For example, the inlet port 228 protrudes through the first side wall 220 and connects with the first channel 234. Similarly, the outlet port 230 protrudes through the second side wall 222 and connects with the second channel 236. The plurality of first orifices 238 includes two first orifices, e.g., a first orifice 238A and another first orifice 238B, which are positioned adjacent to one another at a mid-region of the second cooling component 204. Each of the plurality of first orifices 238 protrude between the upper surface 216 and the lower surface 218 of the second cooling component 204. The plurality of second orifices 240 includes four second orifices, e.g., a second orifice 240A, another second orifice 240B, yet another second orifice 240C, and yet another second orifice 240D, where each of those four orifices are positioned proximate to four corners of the second cooling component 204.

Referring to FIG. 2B, the plurality of distribution conduits 232 are formed on the lower surface 218 of the second cooling component 204. For example, the lower surface 218 of the second cooling component 204 may be machined to form the plurality of distribution conduits 232. In one or more examples, the machining of the lower surface 218 may result in forming a plurality of first divider walls 242 that are disposed spaced apart from each other to define the plurality of distribution conduits 232. In one or more examples, the plurality of distribution conduits 232 includes a first set of distribution conduits 232A and a second set of distribution conduits 232B that are arranged along multiple columns 212. For example, the first set of distribution conduits 232A are arranged along the first column 212A and the second set of distribution conduits 232B are arranged along the second column 212B. In other words, the plurality of distribution conduits 232 includes a first distribution conduit $232A_1$ and a second distribution conduit $232A_2$ that are arranged along the first column 212A, and a third distribution conduit $232B_1$ and a fourth distribution conduit $232B_2$ that are arranged along the second column 212B. Further, the first distribution conduit $232A_1$ and the second distribution conduit $232A_2$ have a first common head section 233 and the third distribution conduit $232B_1$ and the fourth distribution conduit $232B_2$ have a second common head section 235. In such examples, the first common head section 233 is connected to the first orifice 238A and the second common head section 235 is connected to another first orifice 238B. Further, the first distribution conduit $232A_1$ is connected to the second orifice 240A and the second distribution conduit $232A_2$ is connected to another second orifice 240B of the plurality of second orifices 240. Similarly, the third distribution conduit $232B_1$ is connected to yet another second orifice 240C and the fourth distribution conduit $232B_2$ is connected to yet another second orifice 240D.

Referring to FIG. 2C, the first channel 234 and the second channel 236 are formed on the upper surface 216 of the second cooling component 204. As discussed herein, the upper surface 216 of the second cooling component 204 may be machined to form the first channel 234 and the second channel 236. In some examples, the machining of the upper surface 216 may result in forming a plurality of second divider walls 244 and a plurality of third divider walls 246 to define the plurality of first channel 234 and the second channel 236, respectively. In some examples, the plurality of second divider walls 244 additionally splits the first channel 234 into a first leg 234A of the first channel 234 and a second leg 234B of the first channel 234. As discussed herein, the first channel 234 is connected to the inlet port 228. Further, the first leg 234A of the first channel 234 is connected to the first orifice 238A and the second leg 234B of the first channel 234 is connected to another first orifice 238B. Similarly, the plurality of third divider walls 246 first splits the second channel 236 into a first leg 236A of the second channel 236 and a second leg 236B of the second channel 236. The plurality of third divider walls 246 further splits the first leg 236A of the second channel 236 into first sub-leg $236A_1$ and a second sub-leg $236A_2$. Similarly, the plurality of third divider walls 246 further splits the second leg 236B of the second channel 236 into a third sub-leg $236B_1$ and a fourth sub-leg $236B_2$.

Referring back to FIG. 2B, the first orifice 238A has a first width "$W_1$" and the other first orifice 238B has a second width "$W_2$". In some examples, the second width "$W_2$" is greater than the first width "$W_1$" so as allow a maximum flow of coolant 260 into the second distribution conduit 232B for greater amount of heat dissipation from one or more chips in a second chipset 206B (as shown in FIG. 2) located at the second column 212B. In some other examples, the first width "$W_1$" and the second width "$W_2$" are substantially equal. In some other examples, the first width "$W_1$" may be greater than the second width "$W_2$".

Referring to FIGS. 2B-2C, each of the plurality of distribution conduits 232 is fluidically coupled to the inlet port 228 and the outlet port 230. For example, the first distribution conduit $232A_1$ is fluidically coupled to the inlet port 228 and the outlet port 230 via i) the first leg 234A of the first channel 234, ii) the first orifice 238A, iii) the second orifice 240A, and iv) the first sub-leg $236A_1$ and the second sub-leg $236A_2$ of the second channel 236. As discussed herein, the second distribution conduit 232B, the third distribution conduit 232C, and the fourth distribution conduit 232D are also connected to the inlet port 228 and the outlet port 230.

Figure 2D:
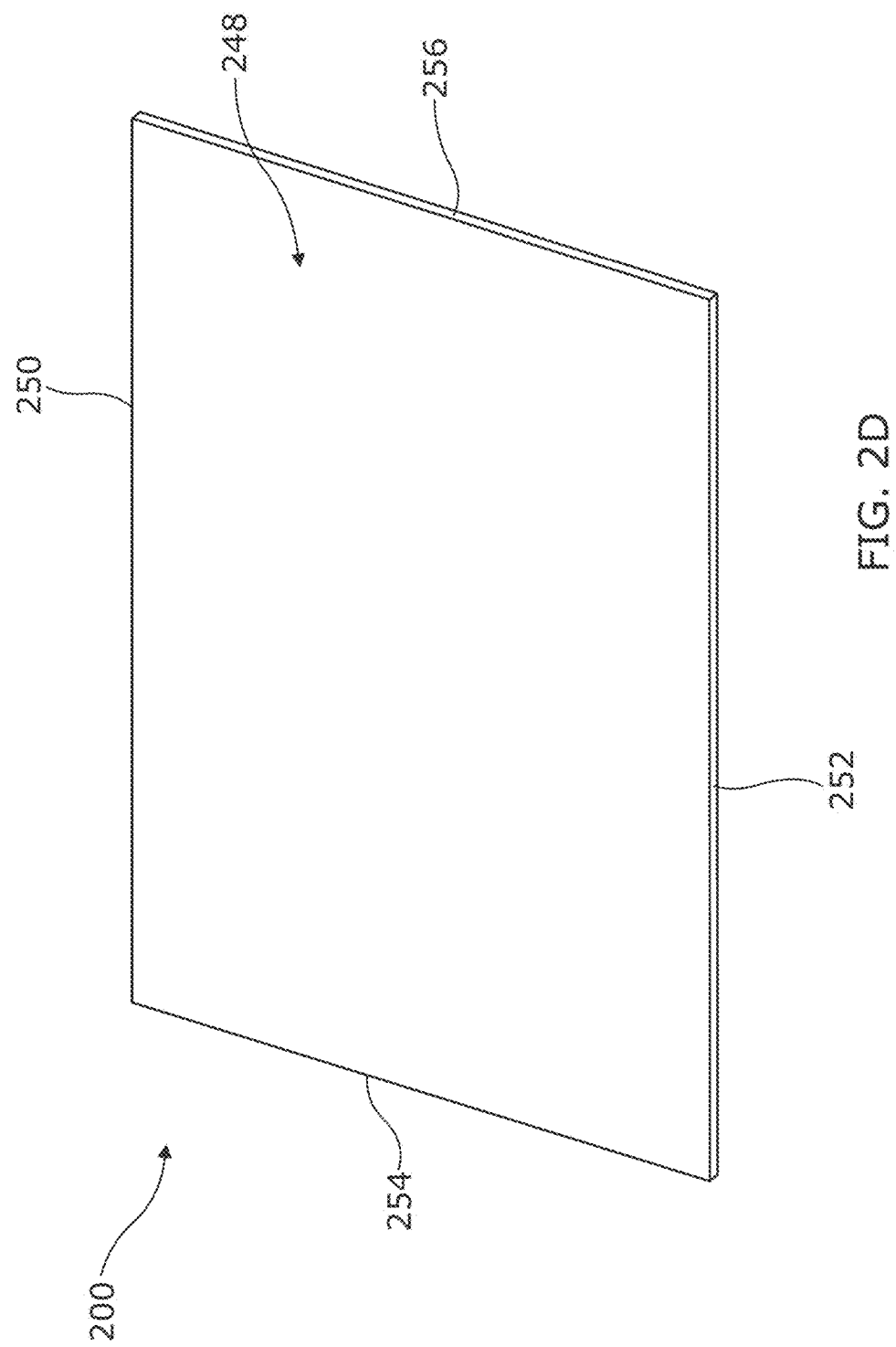
FIG. 2D illustrates a lid of the cooling module of FIG. 2A according to an example implementation of the present disclosure.

FIG. 2D depicts a lid 248 of the cooling module 200. The lid 248 is a thermally conductive component. For example, the lid 248 may be formed using a thermally conductive material, such as copper, aluminum, or alloy. The lid 248 may be a rectangular-shaped or square-shaped component. The shape of the lid 248 may depend on the shape of a second cooling component 204. In some examples, the lid 248 has a first wall 250, a second wall 252, a third wall 254, and a fourth wall 256. In such examples, the lid 248 may be disposed on the upper surface 216 such that the first, second, third, and fourth walls 250, 252, 254, 256, respectively contact the first, second, third, and fourth side walls 220, 222, 224, 226, respectively of the second cooling component 204 and press-fit with the second cooling component 204. In such examples, the lid 248 covers the first channel 234 and the second channel 236 and prevents the leakage of the coolant 260 from the upper surface 216 of the second cooling component 204. It may be noted herein at least one of the second cooling component 204 or the lid 248 may include a plurality of sealing components (not shown) to prevent the leakage of the coolant 260.

Figure 4:
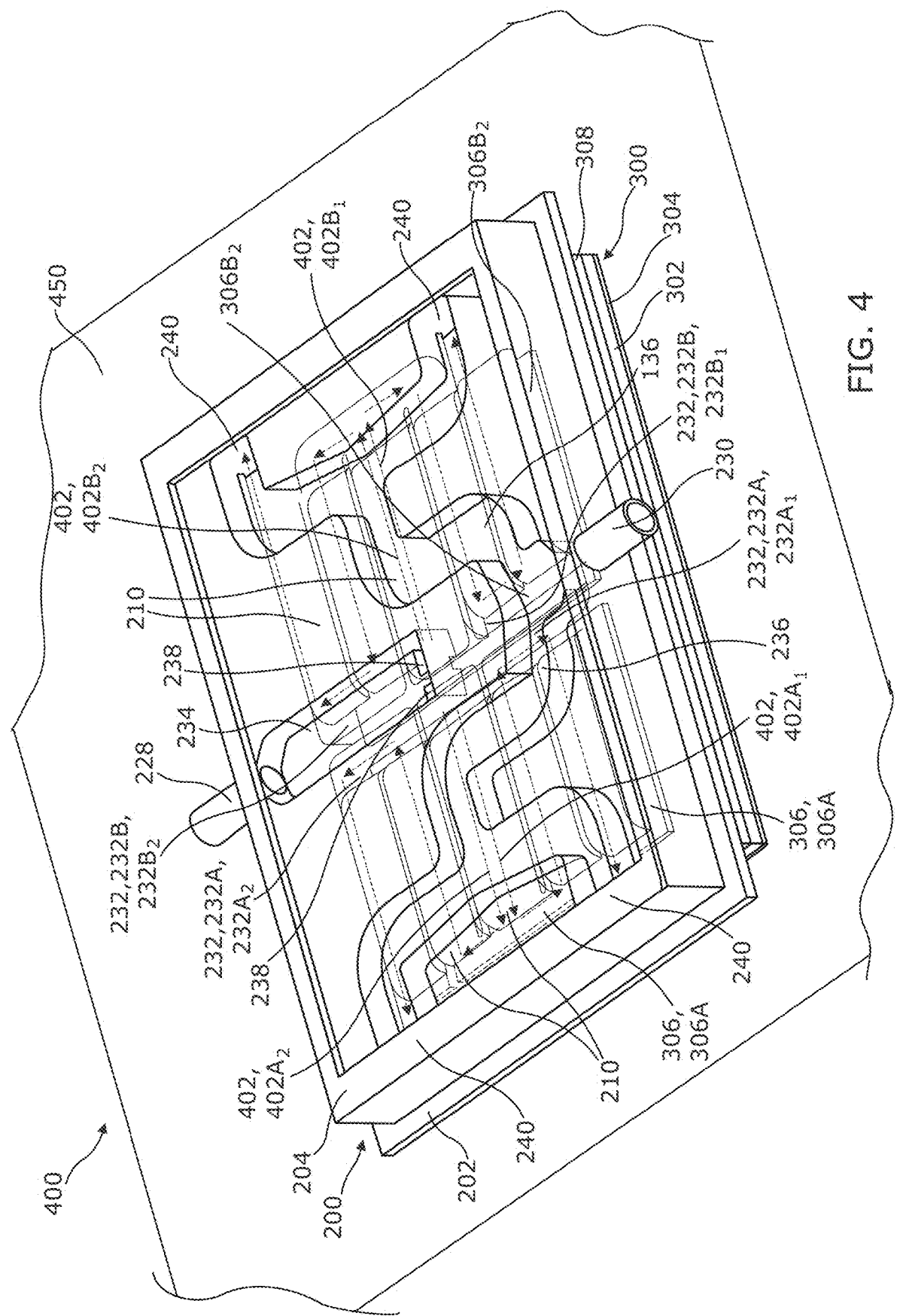
FIG. 4 illustrates a perspective view of a circuit assembly including the cooling module of FIGS. 2A-2D disposed on a circuit module of FIG. 3 according to an example implementation of the present disclosure.

FIG. 3 depicts a perspective view of a circuit module 300. The circuit module 300 may function as a multi-chip module of a circuit assembly 400 (as shown in FIG. 4). In some examples, the circuit module 300 includes a substrate 302, a grid array 304, a plurality of chipsets 306, and a plurality of flanges 308. The circuit module 300 may be one configuration of the circuit module 150 described above. Thus, various components of the circuit module 300 may be similar to components of the circuit module 150 described above. The above descriptions of components of the circuit module 150 are applicable to the similar components of the circuit module 300, and thus duplicative descriptions are omitted below to improve clarity. Although the circuit module 300 may be one configuration of the circuit module 150, the circuit module 150 is not limited to the configuration of the circuit module 300.

In some examples, the substrate 302 may be a rectangular-shaped or square-shaped component. The shape of the substrate 302 may depend on the shape of a first cooling component 202 (as shown in FIG. 2A). The substrate 302 may include several electrically conductive traces (not shown) to electrically interconnect the plurality of chipsets 306. The grid array 304 may be positioned at a lower surface 310 of the substrate 302 to enable the circuit module 300 to be removably coupled (e.g., soldered) to a printed circuit board 450 (as shown in FIG. 4) of a circuit assembly 400. In some examples, the printed circuit board 450 of the circuit assembly 400 may additionally include other electronic elements, such as capacitors, inductors, resistors, or the like. The plurality of flanges 308 is disposed on an upper surface 312 of the substrate 302 and coupled to a perimeter (not labeled) of the substrate 302. The plurality of flanges 308 may support the cooling module 200 (as shown in FIGS. 2A-2D), when mounted on the circuit module 300. Further, the plurality of flanges 308 may provision the circuit module 300 to mechanically connect an assembly of cooling module 200 and the circuit module 300 to the circuit assembly 400.

In some examples, the plurality of chipsets 306 are positioned adjacent to each other and coupled to the upper surface 312 of the substrate 302 by suitable fastening mechanisms, such as solder joints. Each of the plurality of chipsets 306 may include multiple chips, such as, but are not limited to, a CPU, a GPU, power supply chips, memory chips, or the like.

In the example of FIG. 3, the plurality of chipsets 306 includes a first chipset 306A and a second chipset 306B that are arranged along multiple columns 212. For example, the first chipset 306A is arranged along the first column 212A and the second chipset 306B is arranged along the second column 212B. The first chipset 306A includes a first chip $306A_1$ and a plurality of second chips $306A_2$. In such examples, the first chip $306A_1$ is positioned at a center of the first column 212A and the plurality of second chips $306A_2$ are positioned partially surrounding the first chip $306A_1$. In the example of FIG. 3, the plurality of second chips $306A_2$ includes one second chip $306A_{21}$, another second chip $306A_{22}$, yet another second chip $306A_{23}$, and yet another second chip $306A_{24}$.

As discussed herein, the second chipset 306B includes a first chip $306B_1$ and a plurality of second chips $306B_2$. In such examples, the first chip $306B_1$ is positioned at the center of the second column 212B and the plurality of second chips $306B_2$ are positioned partially surrounding the first chip $306B_1$ In the example of FIG. 3, the plurality of second chips $306B_2$ includes one second chip $306B_{21}$, another second chip $306B_{22}$, yet another second chip $306B_{23}$, and yet another second chip $306B_{24}$.

In one example, the first chip $306A_1$ is a GPU, the first chip $306B_1$ is a CPU, and each of the plurality of second chips $306A_2$, $306B_2$ is a memory chip. Further, while the circuit module 300 of FIG. 3 is shown to include three types of chips arranged in a specific fashion, the scope of the present disclosure is not limited with respect to the number or types of chips and the manner in which the chips are shown to be laid out on the substrate 302.

FIG. 4 depicts a perspective view of a circuit assembly 400 including the cooling module 200 of FIGS. 2A-2D disposed on a circuit module 300 of FIG. 3. The circuit assembly 400 is configured to provide mechanical protection to a circuit module 300, dissipate waste heat from the circuit module 300, and distribute electrical energy for the functioning of the circuit module 300 to execute one or more workloads. In one or more examples, the circuit assembly 400 may be disposed within a chassis (not shown) of an electronic device, such as, but not limited to, computer (e.g., server, storage device, etc.), networking device (wireless access point, router, switch, etc.), or the like. The circuit module 300 may be removably coupled to a printed circuit board 450, e.g., a mother board of the circuit assembly 400 via the grid array 304 of the circuit module 300, and the cooling module 200 may be assembled on the circuit module 300. It may be noted herein that the lid 248 (as shown in FIG. 2D) of the cooling module 200 is not shown in the example of FIG. 4 for ease of illustration. The circuit assembly 400 may further include electronic components, such as, but not limited to, resistors, capacitors, or the like (not shown).

In some examples, the first cooling component 202 is disposed on the circuit module 300 such that a lower surface 208 (as labeled in FIG. 2A) of the first cooling component 202 is positioned on the plurality of chipsets 306 and the perimeter of the first cooling component 202 is rested on the plurality of flanges 308 of the circuit module 300. Moreover, the first cooling component 202 is disposed on the circuit module 300, such that the plurality of microchannel blocks 210 formed on the upper surface 206 (as labeled in FIG. 2A) of the first cooling component 202 is thermally coupled to the plurality of chipsets 306 of the circuit module 300 via the lower surface 208.

Furthermore, the second cooling component 204 is disposed on the first cooling component 202 such that each distribution conduit 232 is disposed on one or more microchannel blocks 210 and a plurality of flow paths 402 (e.g., a plurality of serpentine flow paths) is defined between the first cooling component 202 and the second cooling component 204. In other words, each distribution conduit 232 of the plurality of first and second distribution conduits 232A, 232B, respectively defines the serpentine flow path 402, which aligns vertically over a portion of the first chip 306$A_1$, 306$B_1$ and one or more second chips of the plurality of second chips 306$A_2$, 306$B_2$. In some examples, the first distribution conduit 232$A_1$ has a first flow path 402$A_1$, the second distribution conduit 232$A_2$ has a second flow path 402$A_2$, the third distribution conduit 232$B_1$ has a third flow path 402$B_1$, and the fourth distribution conduit 232$B_2$ has a fourth flow path 402$B_2$. In one or more examples, each of the plurality of flow paths 402 includes the one or more microchannel blocks 210. In one or more examples, when the second cooling component 204 is disposed on the first cooling component 202, each distribution conduit 232 may press fit on the one or more microchannel blocks 210 such that there is no gap between the corresponding distribution conduit 232 and each microchannel block of the one or more microchannel blocks 210. Hence, when the coolant 260 (as shown in FIG. 2B) flows along the corresponding serpentine flow path 402, it may be directed to pass through the plurality of microchannels 215 (as shown in FIG. 2A) in each of the one or more microchannel blocks 210. In some examples, each of the plurality of microchannels 215 has a linear flow path. The coolant 260 flowing through the plurality of microchannels 215 in each of the one or more microchannel blocks 210 may absorb some portion of waste heat transferred to the one or more microchannel blocks 210 from the portion of the first chip 206$A_1$, 206$B_1$ and one or more second chips of the plurality of second chips 206$A_2$, 206$B_2$. It may be noted herein that the flow of coolant 260 in the cooling module 200 and dissipation of waste heat from the circuit module 300 are discussed in greater details below.

FIG. 5A depicts a perspective view of a portion of one microchannel block, for example, the microchannel block 210$A_1$ (as additionally shown in FIG. 2A) of the first cooling component 202. In some examples, the microchannel block 210$A_1$ has a plurality of elongated fins 214$A_1$ which are disposed spaced apart from each other to define a plurality of microchannels 215$A_1$ therebetween. In the example of FIG. 5A, each elongated fin of the plurality of elongated fins 214$A_1$ in the microchannel block 210$A_1$ has a thickness "$T_1$". In some examples, the thickness "$T_1$" is greater (may be about 0.5 times greater) than a thickness of each elongated fin of some other microchannel blocks, e.g., the microchannel blocks 210$A_3$ (as shown in FIG. 2A) of the plurality of microchannel blocks 210. The plurality of elongated fins 214$A_1$ having a greater thickness may provide a less surface contact area for the coolant to flow through the microchannel block and have a greater heat transfer co-efficient. Accordingly, the microchannel block 210A having varied thickness of the plurality of elongated fins 214A may regulate the heat transfer rate between the one or more chipsets 306 and the coolant 260.

FIG. 5B depicts a perspective view of a portion of another microchannel block, for example, the microchannel block 210$B_1$ of the first cooling component 202. In some examples, the microchannel block 210$B_1$ has a plurality of elongated fins 214$B_1$ which are disposed spaced apart from each other to define a plurality of microchannels 215$B_1$ therebetween. In the example of FIG. 5B, each elongated fin of the plurality of elongated fins 214$B_1$ in the microchannel block 210$B_1$ has a spacing "$S_1$" between an adjacent elongated fin 214$B_1$. In some examples, the spacing "$S_1$" is less (may be about 0.5 times less) than a spacing between elongated fins of some other microchannel blocks, e.g., the microchannel blocks 210$B_3$ (as shown in FIG. 2A) of the plurality of microchannel blocks 210. The plurality of elongated fins 214$B_1$ having a less spacing may provide a less surface contact area for the coolant to flow through the microchannel block and have a greater heat transfer co-efficient. Accordingly, the microchannel block 210B having a varied spacing between the plurality of elongated fins 214B may regulate the heat transfer rate between the one or more chipsets 306 and the coolant 260.

FIG. 5C depicts a perspective view of a portion of yet another microchannel block, for example, the microchannel block 210$A_2$ of the first cooling component 202. In some examples, the microchannel block 210$A_2$ has a plurality of elongated fins 214$A_2$ which are disposed spaced apart from each other to define a plurality of microchannels 215$A_2$ therebetween. In the example of FIG. 5C, each elongated fin of the plurality of elongated fins 214$A_2$ in the microchannel block 210$A_3$ has a height "$H_1$". In some examples, the height "$H_1$" is less (may be about 0.5 times less) than a height of the elongated fin of some other microchannel blocks, e.g., the microchannel blocks 210$A_3$ (as shown in FIG. 2A) of the plurality of microchannel blocks 210. The plurality of elongated fins 214$A_2$ having a less height may provide a less surface contact area for the coolant to flow through the microchannel block and have a greater heat transfer co-efficient. Accordingly, the microchannel block 210A having a varied height of the plurality of elongated fins 214A may regulate the heat transfer rate between the one or more chipsets 306 and the coolant 260.

Referring to FIGS. 5A-5C, since at least one of the height of the elongated fins or thickness of the elongated fins, or the spacing between elongated fins of at least one microchannel block, which is thermally coupled to the first chip having the high case temperature is varied, a heat transfer rate between the first chip and the coolant may be regulated (e.g., increased). For example, the plurality of elongated fins 214$A_1$ of the microchannel block 210$A_1$ having a substantially greater thickness, or the plurality of elongated fins 214$B_1$ of the microchannel block 210$B_1$ having a substantially less spacing between the elongated fins may provide a less surface contact area for the coolant to flow through the at least one microchannel block. Accordingly, the at least one microchannel block having such variations in at least one of the height, thickness, or spacing between the elongated fins may allow the coolant to flow at a high velocity through the at least one microchannel block and have a greater heat transfer co-efficient. In some examples, the height of each fin of the plurality of elongated fins may be in a range from about 1.5 millimeters (mm) to about 6 mm. The thickness of each fin of the plurality of elongated fins may be in a range from about 0.1 mm to about 1 mm. The spacing between fins in the plurality of elongated fins may be about 0.15 mm to about 2 mm. In some examples, the coolant may be one of a mixture of water and propylene glycol, a dielectric fluid, or a treated water.

Figure 6A:
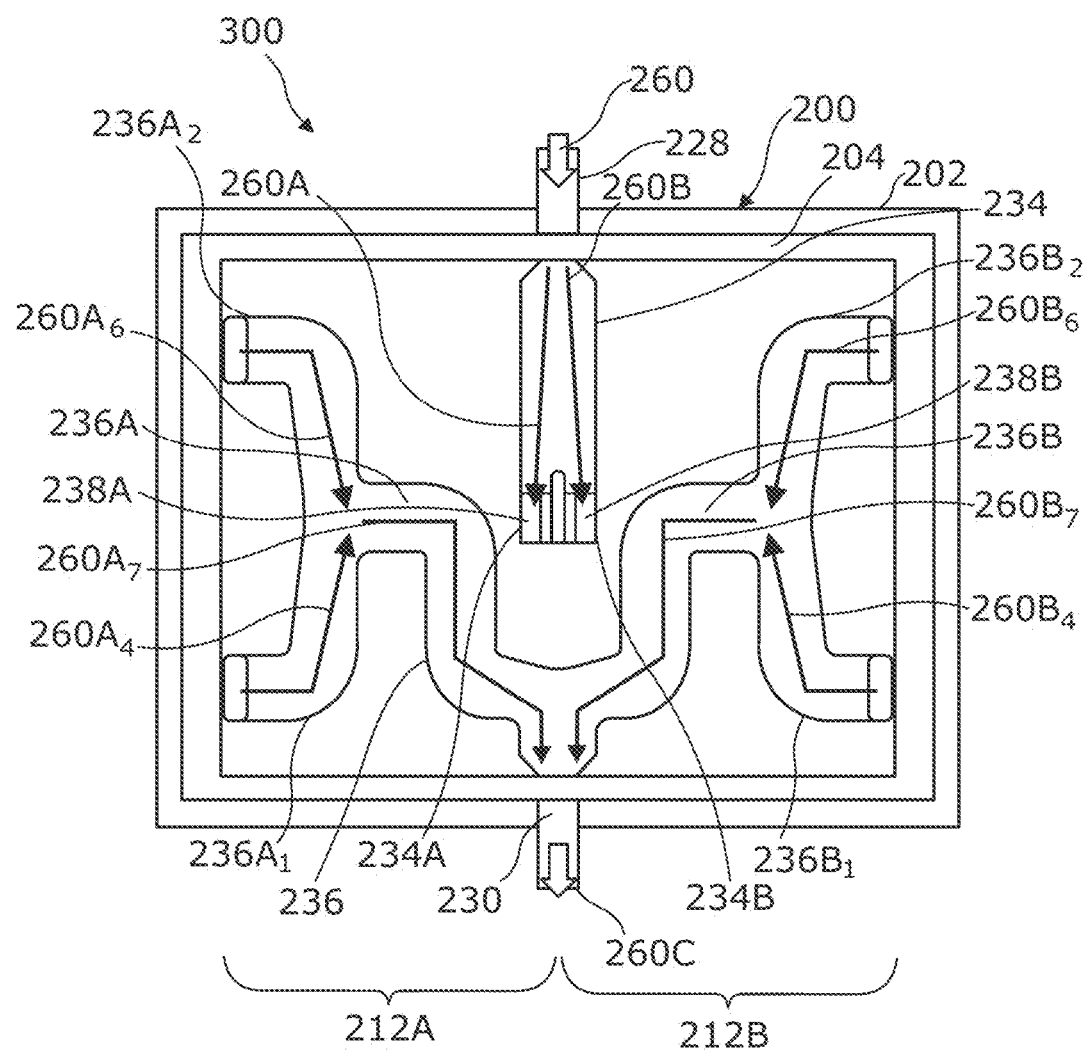
FIG. 6A illustrates a schematic diagram of the circuit assembly of FIG. 4 showing a flow of coolant along an upper surface of the second cooling component according to an example implementation of the present disclosure.
Figure 6B:
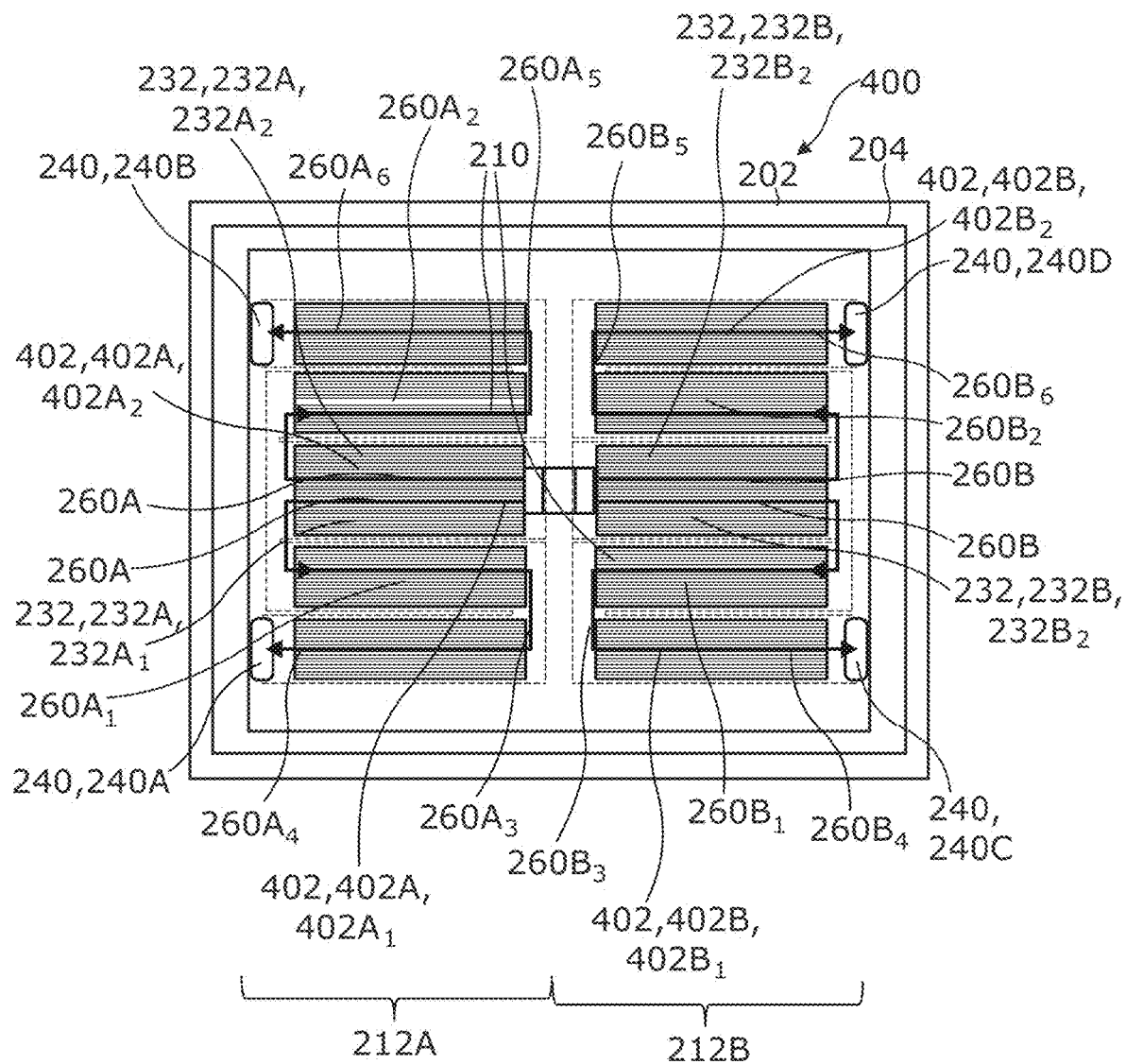
FIG. 6B illustrates a schematic diagram of the circuit assembly of FIG. 4 showing the flow of coolant in a plurality of flow paths defined between an upper surface of the first cooling component and a lower surface of the second cooling component according to an example implementation of the present disclosure.

FIG. 6A depicts a schematic diagram of the circuit assembly 400 of FIG. 4 showing a flow of coolant 260 along an upper surface 216 of the second cooling component 204. FIG. 6B depicts a schematic diagram of the circuit assembly 400 of FIG. 4 showing the flow of coolant 260 in a plurality of flow paths 402 defined between an upper surface 206 of the first cooling component 202 and a lower surface 218 of the second cooling component 204 of the cooling module 200. In the description hereinafter, the Figures, FIGS. 6A-6B are described concurrently for ease of illustration. Further, the Figures, FIGS. 6A-6B are described with reference to FIGS. 2A-2D and FIGS. 3-4. Therefore, the cooling module 200 and the circuit module 300 are not described again for the sake of brevity of the description. It may be noted herein that the lid 248 (as shown in FIG. 2D) of the cooling module 200 is not shown in the example of FIGS. 6A-6B for ease of illustration.

During the operation of the circuit assembly 400, the plurality of chipsets 306 may generate waste heat. As will be understood, such waste heat generated by the plurality of chipsets 306 is undesirable and may negatively impact operation of the circuit module 300 if the waste heat is not managed effectively. Accordingly, in some examples, the proposed cooling module 200 may establish sufficient thermal interfaces with the circuit module 300 to enable efficient waste heat transfer from the first chip $306A_1$, $306B_1$, and the plurality of second chips $306A_2$, $306B_2$ to coolant 260 via the first and second cooling components 202, 204, respectively.

In some examples, the CDU (not shown) of a data center environment may supply the coolant 260 to the cooling module 200 via an inlet manifold (not shown) connected to the inlet port 228 of the second cooling component 204. Referring to FIG. 6A, the second cooling component 204 directs the coolant 260 into the first channel 234 via the inlet port 228. The first channel 234 bifurcates the coolant 260 into a first portion of coolant 260A and a second portion of coolant 260B via the plurality of second divider walls 244 (as shown in FIG. 2C). Referring to FIGS. 6A-6B, the first channel 234 may direct the first portion of coolant 260A into flow paths 402A defined along the first column 212A via the first orifice 238A, and the second portion of coolant 260B into flow paths 402B defined along the second column 212B via the other first orifice 238B.

Referring to the first column 212A of the cooling module 200 in FIG. 6B, the first portion of coolant 260A flows along a first common head section 233 (as shown in FIG. 2B) of the first flow path $402A_1$ and the second flow path $402A_2$. In such examples, the first portion of coolant 260A is first directed through a plurality of microchannels $215A_1$ (as shown in FIG. 5A) of the microchannel block $210A_1$. As the first portion of coolant 260A flows through the plurality of microchannels $215A_1$, it absorbs waste heat from a portion of first chip $306A_1$. The first portion of coolant 260A is further bifurcated by the plurality of first divider walls 242 (as shown in FIG. 2B) into a first sub-portion of coolant $260A_1$ and a second sub-portion of coolant $260A_2$.

The first sub-portion of coolant $260A_1$ is directed through a remaining portion of the first flow path $402A_1$. The first sub-portion of coolant $260A_1$ flowing along the remaining portion of the first flow path $402A_1$ is directed to flow through a plurality of microchannels (not labeled) of the microchannel block $210A_2$ (as shown in FIG. 2A) and subsequently through a plurality of microchannels of the microchannel block $210A_3$ (as shown in FIG. 2A). For example, the first sub-portion of coolant $260A_1$ first flows through the plurality of microchannels of the microchannel block $210A_2$ and absorbs waste heat from another portion of the first chip $306A_1$ to generate a first sub-portion of partially heated coolant $260A_3$. Subsequently, the first sub-portion of partially heated coolant $260A_3$ flows through the plurality of microchannels of the microchannel block $210A_3$ absorbs waste heat from the second chips $306A_{21}$ and $306A_{22}$ (as shown in FIG. 2) generate a first sub-portion of heated coolant $260A_4$.

The second sub-portion of coolant $260A_2$ is directed through a remaining portion of the second flow path $402A_2$. The second sub-portion of coolant $260A_2$ flowing along the remaining portion of the second flow path $402A_2$ is directed to flow through a plurality of microchannels (not labeled) of the microchannel block $210A_4$ (as shown in FIG. 2A) and subsequently through a plurality of microchannels (not labeled) of the microchannel block $210A_5$ (as shown in FIG. 2A). For example, the second sub-portion of coolant $260A_2$ first flows through the plurality of microchannels of the microchannel block $210A_4$ and absorbs waste heat from yet another portion of the first chip $306A_1$ to generate a second sub-portion of partially heated coolant $260A_5$. Subsequently, the second sub-portion of partially heated coolant $260A_5$ flows through the plurality of microchannels of the microchannel block $210A_5$ absorbs waste heat from the second chips $306A_{23}$ and $306A_{24}$ (as shown in FIG. 2) generate a second sub-portion of heated coolant $260A_6$.

Referring to the second column 212B of the cooling module 200 in FIG. 6B, the second portion of coolant 260B flows along a second common head section 235 (as shown in FIG. 2B) of the third flow path $402B_1$ and the fourth flow path $402B_2$. In such examples, the second portion of coolant 260B is directed through a plurality of microchannels $215B_1$ (as shown in FIG. 5B) of the microchannel block $210B_1$. As the second portion of coolant 260B flows through the plurality of microchannels $215B_1$, it absorbs waste heat from a portion of the first chip $306B_1$. Later, the second portion of coolant 260B is bifurcated by the plurality of first divider walls 242 (as shown in FIG. 2B) into a third sub-portion of coolant $260B_1$ and a fourth sub-portion of coolant $260B_2$.

The third sub-portion of coolant $260B_1$ is directed through a remaining portion of the third flow path $402B_1$. The third sub-portion of coolant $260B_1$ flowing along the remaining portion of the third flow path $402B_1$ is directed to flow through a plurality of microchannels (not labeled) of the microchannel block $210B_2$ (as shown in FIG. 2A) and subsequently through a plurality of microchannels of the microchannel block $210B_3$ (as shown in FIG. 2A). For example, the third sub-portion of coolant $260B_1$ first flows through the plurality of microchannels of the microchannel block $210B_2$ and absorbs waste heat from the other portion of the first chip $306B_1$ to generate a third sub-portion of partially heated coolant $260B_3$. Subsequently, the third sub-portion of partially heated coolant $260B_3$ flows through the plurality of microchannels of the microchannel block $210B_3$ and absorbs waste heat from the second chips $306B_{21}$ and $306B_{22}$ (as shown in FIG. 2) to generate a third sub-portion of heated coolant $260B_4$.

The fourth sub-portion of coolant $260B_2$ is directed through a remaining portion of the fourth flow path $402B_2$ defined by the fourth distribution conduit $232B_2$. The fourth sub-portion of coolant $260B_2$ flowing along the remaining portion of the fourth flow path $402B_2$ is directed to flow through a plurality of microchannels (not labeled) of the microchannel block $210B_4$ (a shown in FIG. 2A) and subsequently through a plurality of microchannel of the microchannel block $210B_5$ (as shown in FIG. 2A). For example, the second sub-portion of coolant $260B_1$ first flows through the plurality of microchannels of the microchannel block $210B_4$ and absorbs waste heat from yet another portion of the first chip $306B_1$, to generate a fourth sub-portion of partially heated coolant $260B_5$. Subsequently, the fourth sub-portion of partially heated coolant $260B_5$ flows through the plurality of microchannels of the microchannel block $210B_5$ and absorbs waste heat from the second chips $306B_{23}$ and $306B_{24}$ (as shown in FIG. 3) to generate a fourth sub-portion of heated coolant $260B_6$. Therefore, in accordance with some examples of the present disclosure, each distribution conduit 232 directs the coolant 260 through the one or more microchannel blocks 210 to: i) absorb the waste heat from a portion of the first chip and ii) subsequently absorb the waste heat from the one or more second chips.

Referring back to FIG. 6A, the first sub-portion of heated coolant $260A_4$ flows from the first distribution conduit $232A_1$ into the first sub-leg $236A_1$ of the second channel 236 in the first cooling component 202 via the second orifice 240A. Further, the second sub-portion of heated coolant $260A_6$ flows from the second distribution conduit $232A_2$ into the second sub-leg $236A_2$ of the second channel 236 in the first cooling component 202 via the other second orifice 240B. Similarly, the third sub-portion of heated coolant $260B_4$ flows from the third distribution conduit $232B_1$ into the third sub-leg $236B_1$ of the second channel 236 in the first cooling component 202 via another second orifice 240C. Further, the fourth sub-portion of heated coolant $260B_6$ flows from the fourth distribution conduit $232B_2$ into the fourth sub-leg $236B_2$ of the second channel 236 in the first cooling component 202 via another second orifice 240D.

The first sub-portion of heated coolant $260A_4$ and the second sub-portion of heated coolant $260A_6$ are merged along the first leg 236A of the second channel 236 in the first cooling component 202 via the plurality of third divider walls 246 (as shown in FIG. 2C) to form a first portion of heated coolant $260A_7$. Similarly, the third sub-portion and the fourth sub-portion of heated coolant $260B_4$, $260B_6$ are merged along the second leg 236B of the second channel 236 in the first cooling component 202 via the plurality of third divider walls 246 to form a second portion of heated coolant $260B_8$. Further, the first portion of heated coolant $260A_7$ and the second portion of heated coolant $260B_8$ are merged together along the second channel 236 to form a heated coolant 260C. In such examples, the heated coolant 260C is discharged from the cooling module 200 to the CDU via an outlet manifold (not shown) connected to the outlet port 230 of the second cooling component 204.

Since each distribution conduit 232 directs a portion of coolant 260 through one or more microchannel blocks 210 that are thermally coupled to the first chips $306A_1$, $306B_1$ (GPU and/or CPU, respectively) having a high case temperature, the portion of coolant 260 may have a sufficient thermal margin to absorb the waste heat from the first chips $306A_1$, $306B_1$ and to generate a sub-portions of partially heated coolant $260A_3$, $260A_5$, $260B_3$, $260B_5$. Further, since each distribution conduit 232 directs the sub-portions of partially heated coolant $260A_3$, $260A_5$, $260B_3$, $260B_5$ through the one or more microchannel blocks 210 that are thermally coupled to one or more second chips $306A_2$, $306B_2$ having a low case temperature, the sub-portions of partially heated coolant $260A_3$, $260A_5$, $260B_3$, $260B_5$ may still have the sufficient thermal margin to subsequently absorb the waste heat from the one or more second chips $306A_2$, $306B_2$ and to generate the heated coolant 260C. Therefore, the cooling module 200 may be able to adequately and uniformly dissipate the waste heat away from all chipsets 306 in the circuit module 300.

Further, since each distribution conduit 232 defines the serpentine flow path 402 between the first and second cooling components 202, 204 respectively, the coolant 260 may flow at a high velocity for a low volumetric flow rate and have the high heat transfer co-efficient between the cooling module 200 and the coolant 260. Additionally, since the cooling module 200 operates at the low volumetric flow rate, a fewer number of CDUs may handle the coolant requirement of multiple circuit assemblies 400 disposed in several electronic devices of a data center environment. In some examples, the volumetric flow rate may be around 0.12 gallons per minute. In some examples, the cooling module 200 may reduce temperature of the plurality of chipsets 306 by about 2.9 degrees Celsius to 11.7 degrees Celsius.

Figure 7A:
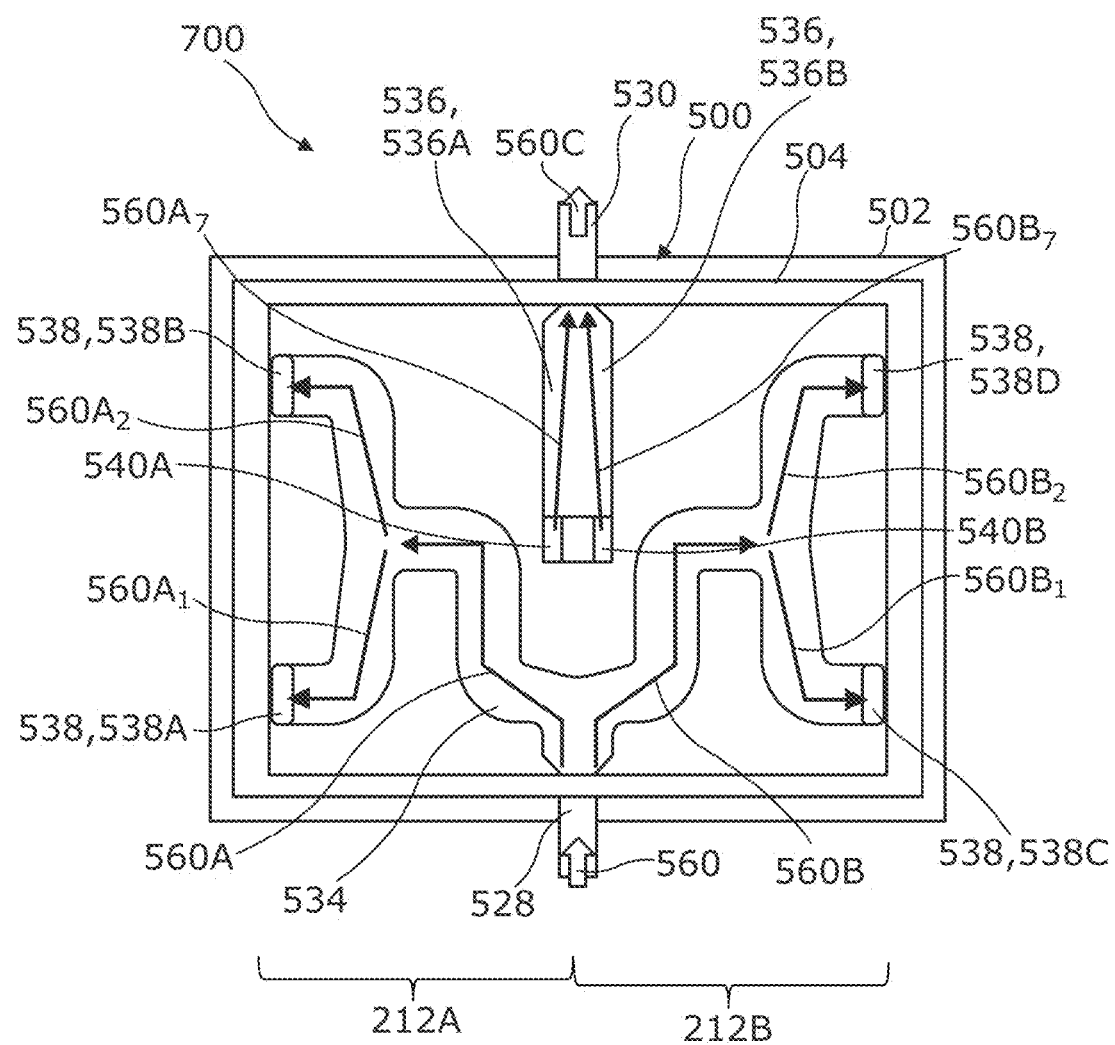
FIG. 7A illustrates a schematic diagram of a circuit assembly showing a flow of coolant along an upper surface of a second cooling component of a cooling module according to another example implementation of the present disclosure.
Figure 7B:
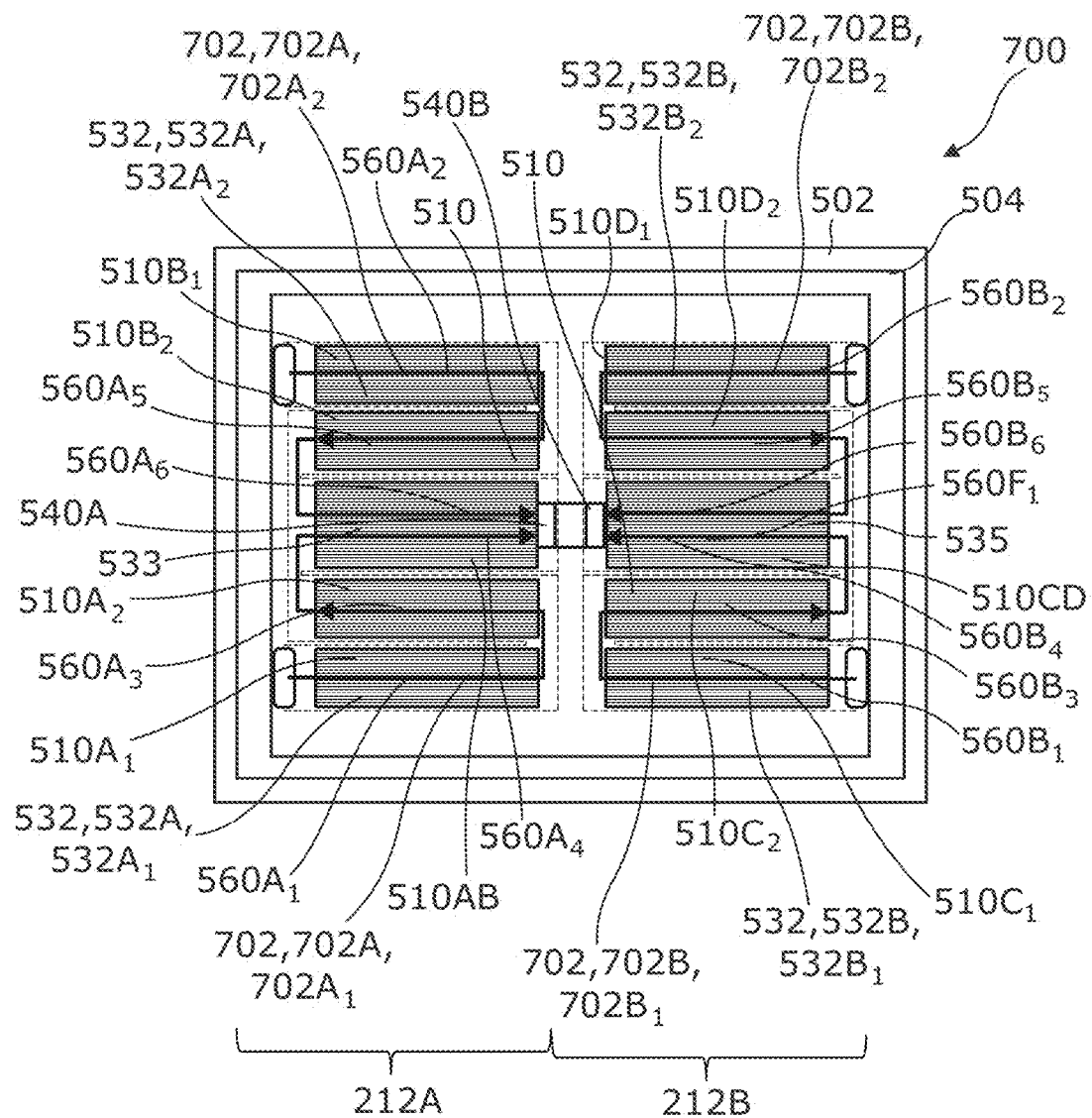
FIG. 7B illustrates a schematic diagram of the circuit assembly of FIG. 7A showing the flow of coolant in a flow path defined between an upper surface of a first cooling component and a lower surface of the second cooling component according to another example implementation of the present disclosure.
Figure 8:
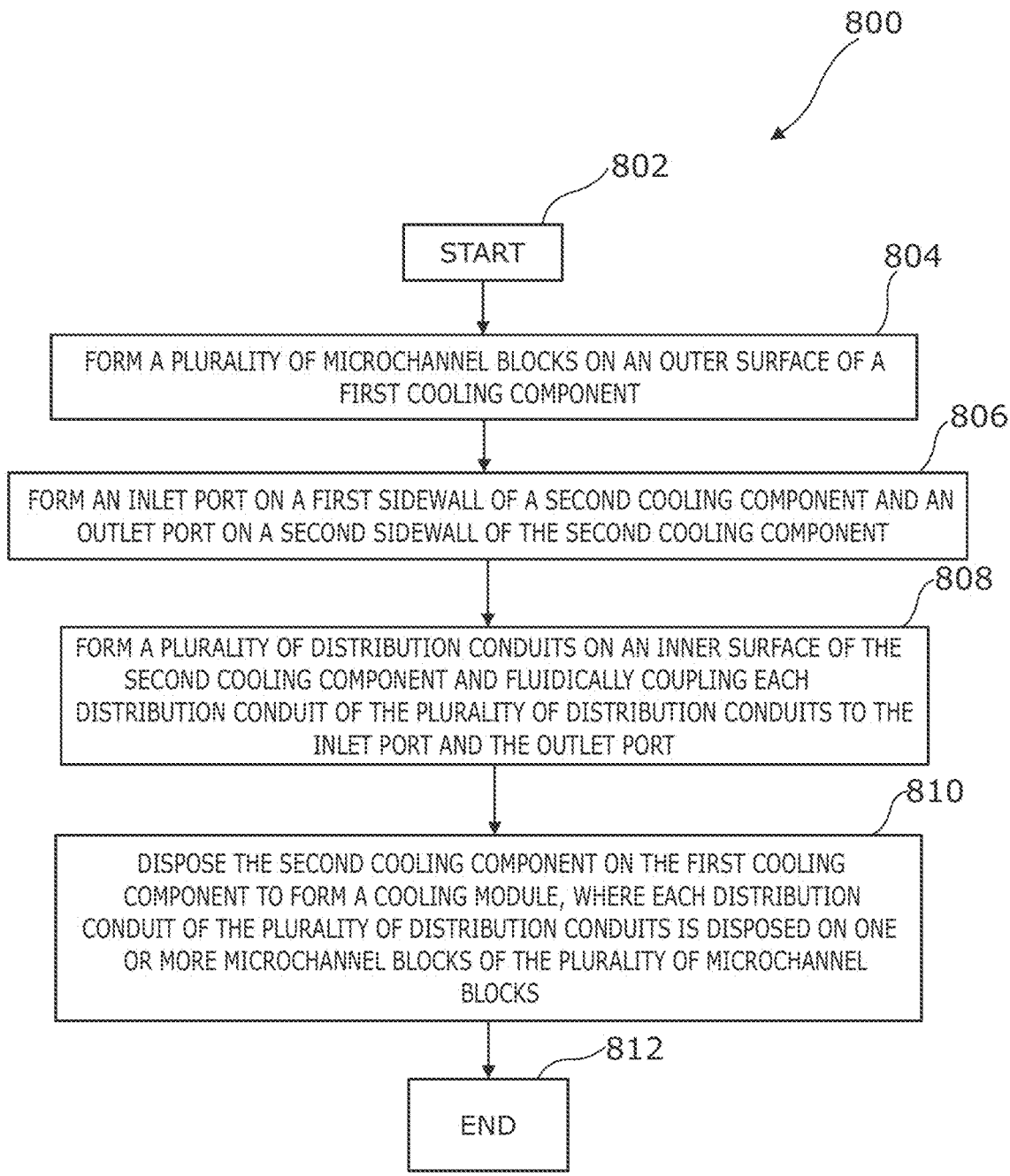
FIG. 8 illustrates a flowchart depicting a method of forming a cooling module according to an example implementation of the present disclosure.

FIG. 7A depicts a schematic diagram of a circuit assembly 700 showing a flow of coolant 560 along an upper surface of a second cooling component 504 of a cooling module 500. FIG. 7B depicts a schematic diagram of the circuit assembly 700 of FIG. 7A showing the flow of coolant 560 along flow paths 702 defined between an upper surface of a first cooling component 502 and a lower surface of the second cooling component 504 of the cooling module 500. In the description hereinafter, the Figures, FIGS. 7A-7B are described concurrently for ease of illustration.

It may be noted herein that the circuit assembly 700 of FIGS. 7A-7B is substantially similar to a circuit assembly 400 of FIGS. 6A-6B. For example, the circuit assembly 700 includes the cooling module 500, which is substantially similar to a cooling module 200 of FIGS. 2A-2D and FIGS. 6A-6B, with exceptions, such as an inlet port 528, an outlet port 530, a first channel 534, a second channel 536, a plurality of first orifices 538, and a plurality of second orifices 540 of the cooling module 500 been interchanged in comparison with an inlet port 228, an outlet port 230, a first channel 234, a second channel 236, a plurality of first orifices 238, and a plurality of second orifices 240 respectively, of the cooling module 200. Further, the circuit assembly 700 includes a circuit module (not labeled), which is similar to a circuit module 300 of FIG. 3 and FIGS. 6A-6B.

Accordingly, as discussed herein in the example of FIG. 2, the circuit module (not shown) of FIGS. 7A-7B may include a plurality of chipsets including a first chipset and a second chipset. The first chipset may be arranged along a first column and the second chipset may be arranged along a second column. In one or more examples, the first chipset may include a first chip (e.g., a GPU) and a plurality of second chips (e.g., memory chips) partially surrounding the first chip. Similarly, the second chipset may include another first chip (e.g., a CPU) and a plurality of other second chips (e.g., memory chips) partially surrounding the other first chip. It may be noted herein that the circuit module is not shown in FIGS. 7A-7B for the purpose of ease of illustration and such an example should not be construed as a limitation of the present disclosure.

The cooling module 500 includes a first cooling component 502 and a second cooling component 504. In one or more examples, the first cooling component 502 and the second cooling component 504 may function as a cold plate. The first cooling component 502 includes a plurality of microchannel blocks 510 thermally coupled to the plurality of chipsets. The second cooling component 504 includes an inlet port 528, an outlet port 530, and a plurality of distribution conduits 532 fluidically coupled to the inlet port 528 and the outlet port 530. The plurality of distribution conduits 532 includes a first set of distribution conduits 532A and a second set of distribution conduits 532B. In the example of FIG. 7A, the first set of distribution conduits 532A includes a first distribution conduit $532A_1$ and a second distribution conduit $532A_2$. The second set of distribution conduits 532B includes a third distribution conduit $532B_1$ and a fourth distribution conduit $532B_2$. In some examples, the second cooling component 504 further includes a plurality of first orifices 538, a plurality of second orifices 540, a first channel 534, and a second channel 536. In such examples, the inlet port 528 is connected to the plurality of first orifices 538 via the first channel 534 and the outlet port 530 is connected to the plurality of second orifices 540 via the second channel 536.

The second cooling component 504 is disposed on the first cooling component 502 such that each of the plurality of distribution conduits 532 is disposed on one or more microchannel blocks of the plurality of microchannel blocks 510. In the example of FIG. 7A, each of the plurality of distribution conduits 532 is fluidically coupled to the inlet port 528 and the outlet port 530 via at least one first orifice of the plurality of first orifices 538, at least one second orifice of the plurality of second orifices 540, the first channel 534, and the second channel 536. It may be noted herein that a lid of the cooling module 500 is not shown in the example of FIGS. 7A-7B for ease of illustration.

During the operation of the circuit assembly 700, the plurality of chipsets may generate waste heat. As will be understood, such waste heat generated by the plurality of chipsets is undesirable and may negatively impact operation of the circuit module, if the waste heat is not managed effectively. Accordingly, in some examples, the proposed cooling module 500 may establish sufficient thermal interfaces with the circuit module to enable efficient waste heat transfer from the first chip, the other first chip, the plurality of second chips, and the plurality of other second chips to coolant 560 via the first and second cooling components 502, 504, respectively.

In some examples, the CDU (not shown) of a data center environment may supply the coolant 560 to the cooling module 500 via an inlet manifold (not shown) connected to the inlet port 528 of the second cooling component 504. The second cooling component 504 directs the coolant 560 into the first channel 534 via the inlet port 528. The first channel 534 bifurcates the coolant 560 into a first portion of coolant 560A and a second portion of coolant 560B. The first channel 534 further bifurcates the first portion of coolant 560A into a first sub-portion of coolant $560A_1$ and a second sub-portion of coolant $560A_2$. Further, the first channel 534 bifurcates the second portion of coolant 560B into a third sub-portion of coolant $560B_1$ and a fourth sub-portion of coolant $560B_2$. Later, the first channel 534 directs the first sub-portion of coolant $560A_1$ into a first flow path $702A_1$ and a second sub-portion of coolant $560A_2$ into a second flow path $702A_2$ defined along the first column 212A via a first orifice 538A and other first orifice 538B, respectively. Further, the first channel 534 directs the third sub-portion of coolant $560B_1$ into a third flow path $702B_1$ and a fourth sub-portion of coolant $560B_2$ into a fourth flow path $702B_2$ defined along the second column 212B via other first orifices 538C, 538D, respectively.

Now referring to the first column 212A of the cooling module 500 in FIG. 7B, the first sub-portion of coolant $560A_1$ flows along the first flow path $702A_1$ defined by the first distribution conduit $532A_1$, which is aligned vertically over the one or more second chips and a portion of the first chip. In some examples, the first sub-portion of coolant $560A_1$ is directed through a microchannel block $510A_1$ located over the one or more second chips. As the first sub-portion of coolant $560A_1$ passes through the microchannel block $510A_1$, it absorbs waste heat from the one or more second chips to generate a first sub-portion of partially heated coolant $560A_3$. Further, the first sub-portion of partially heated coolant $560A_3$ flows through a microchannel block $510A_2$ located over a portion of the first chip and absorbs waste heat from the portion of the first chip. The first sub-portion of partially heated coolant $560A_3$ further flows through a microchannel block 510AB located over yet other portion of the first chip in a first common head section 533 of the first and second distribution conduits $532A_1$ and $532A_2$, respectively. As the first sub-portion of partially heated coolant $560A_3$ flows through the microchannel block 510AB, it absorbs waste heat from the yet other portion of first chip to generate a first sub-portion of heated coolant $560A_4$.

The second sub-portion of coolant $560A_2$ flows along the second flow path $702A_2$ defined by the second distribution conduit $532A_2$, which is aligned vertically over the one or more second chips and other portion of the first chip. In such examples, the second sub-portion of coolant $560A_2$ is directed through a microchannel block $510B_1$ located over the one or more second chips. As the second sub-portion of coolant $560A_2$ flows through the microchannel block $510B_1$, it absorbs waste heat from the one or more second chips to generate a second sub-portion of partially heated coolant $560A_5$. Further, the second sub-portion of partially heated coolant $560A_5$ flows through a microchannel block $510B_2$ located over the other portion of the first chip and absorbs waste heat from the other portion of the first chip. The second sub-portion of partially heated coolant $560A_5$ further flows through the microchannel block 510AB located over the yet other portion of the first chip in the first common head section 533 of the first and second distribution conduits $532A_1$ and $532A_2$, respectively. As the second sub-portion of partially heated coolant $560A_5$ flows through the microchannel block 510AB, it absorbs the waste heat from yet other portion of first chip to generate a second sub-portion of heated coolant $560A_6$.

Now referring to the second column 212B of the cooling module 500 in FIG. 7B, the third sub-portion of coolant $560B_1$ flows along the third flow path $702B_1$ defined by the third distribution conduit $532B_1$, which is aligned vertically over one or more other second chips and a portion of other first chip. In some examples, the third sub-portion of coolant $560B_1$ is directed through a microchannel block $510C_1$ located over the one or more other second chips. As the third sub-portion of coolant $560A_1$ flows through the microchannel block $510C_1$, it absorbs waste heat from the one or more other second chips to generate a first sub-portion of partially heated coolant $560B_3$. Further, the first sub-portion of partially heated coolant $560B_3$ passes through a microchannel block $510C_2$ located over a portion of the other first chip and absorbs the waste heat from the portion of the other first chip. Later, the first sub-portion of partially heated coolant $560B_3$ flows through a microchannel block 510CD located over another portion of the other first chip in a second common head section 535 of the third and fourth distribution conduits $532B_1$ and $532B_2$, respectively. As the first sub-portion of partially heated coolant $560B_3$ passes through the microchannel block 510CD, it absorbs the waste heat from the other portion of the other first chip to generate a third sub-portion of heated coolant $560B_4$.

The fourth sub-portion of coolant $560B_2$ flows along the fourth flow path $702B_2$ defined by the fourth distribution conduit $532B_2$, which is aligned vertically over the one or more other second chips and the other portion of the other first chip. In such examples, the fourth sub-portion of coolant $560B_2$ is directed through a microchannel block $510D_1$ located over the one or more other second chips. As the fourth sub-portion of coolant $560B_2$ flows through the microchannel block $510D_1$, it absorbs waste heat from the one or more other second chips to generate a second sub-portion of partially heated coolant $560B_5$. Further, the second sub-portion of partially heated coolant $560B_5$ flows through a microchannel block $510D_2$ located over the other portion of the other first chip and absorbs waste heat from the other portion of the other first chip. Later, the second sub-portion of partially heated coolant $560B_5$ flows through the microchannel block 510CD located over the other portion of the other first chip in the second common head section 535 of the first and second distribution conduits 532B$_1$, 532$_2$, respectively. As the second sub-portion of partially heated coolant 560B$_5$ flows through the microchannel block 510CD, it absorbs waste heat from other portion of other first chip to generate a fourth sub-portion of heated coolant 560B$_6$. Therefore, in accordance with some examples of the present disclosure, each distribution conduit 532 directs the coolant 560 through the one or more microchannel blocks 510 to: i) absorb the waste heat from one or more second chips and subsequently absorb the waste heat from a portion of the first chip.

Referring back to FIG. 7A, the first sub-portion of heated coolant 560A$_4$ from the first distribution conduit 532A$_1$ and the second sub-portion of heated coolant 560A$_6$ from the second distribution conduit 532A$_2$ flows together as a first merged sub-portion of heated coolant 560A$_7$ into a first leg 536A of the second channel 536 via the one second orifice 540A. Similarly, the third sub-portion of heated coolant 560B$_4$ from the third distribution conduit 532B$_1$ and the fourth sub-portion of heated coolant 560B$_6$ from the fourth distribution conduit 532B$_2$ flows together as a second merged sub-portion of heated coolant 560B$_7$ into a second leg 536B of the second channel 536 via the other second orifice 540B.

The first merged sub-portion of heated coolant 560A$_7$ and the second merged sub-portion of heated coolant 560B$_7$ further merges in the second channel 536 to form a heated coolant 560C. In such examples, the heated coolant 560C is discharged from the cooling module 500 to the CDU via an outlet manifold (not shown) connected to the outlet port 530 of the second cooling component 504.

FIG. 8 is a flowchart depicting a method 800 of forming a cooling module for a circuit module of a circuit assembly. It should be noted herein that the method 800 is described in conjunction with FIGS. 2A-2D, FIGS. 3-4, and FIGS. 6A-6B, for example. The method 800 starts at block 802 and continues to block 804.

At block 804, the method 800 includes forming a plurality of microchannel blocks on an upper surface of a first cooling component of the cooling module. In some examples, a machining process, such as skiving is used to form each of the plurality of microchannel blocks. For example, the upper surface of the first cooling component is skived to form a plurality of elongated fins (e.g., skived fins) of each microchannel block of the plurality of microchannel blocks. In some examples, the plurality of elongated fins of each microchannel block are disposed to be spaced apart from each other to form a plurality of microchannels. In one or more examples, the first cooling component is formed to be arranged in two columns, for example, a first column and a second column. In such examples, the plurality of microchannel blocks disposed along the first column may be categorized as a first set of microchannel blocks and the plurality of microchannel blocks disposed along the second column may be categorized as a second set of microchannel blocks. In some examples, at least one of a height of the plurality of elongated fins, a thickness of the plurality of elongated fins, or the spacing between fins in the plurality of elongated fins of at least one microchannel block is varied to regulate a heat transfer rate between at least one chipset of a plurality of chipsets and coolant via the at least one microchannel block. In some examples, the thickness of each elongated fin of at least one microchannel block may be in a range from about 0.1 mm to about 1 mm. Similarly, the height of each elongated fin of at least one microchannel block may be in a range from about 1.5 mm to about 6 mm. The spacing between fins of at least one microchannel block may be in a range from about 0.12 mm to about 2 mm. The method 800 continues to block 806.

At block 806, the method 800 includes forming an inlet port on a first sidewall of a second cooling component and an outlet port on a second sidewall of the second cooling component of the cooling module. In some examples, the first and second sidewalls may be opposite sidewalls of the second cooling component. The first and second side walls of the second cooling component may be milled to form the inlet port and the outlet port. The method 800 continues to block 808.

At block 808, the method 800 includes forming a plurality of distribution conduits on a lower surface of the second cooling component and fluidically coupling each distribution conduit of the plurality of distribution conduits to the inlet port and the outlet port. The method 800 of forming the plurality of distribution conduits includes machining (e.g., milling or drilling) or molding the lower surface of the second cooling component to form a plurality of first divider walls that are disposed spaced apart from each other to define the plurality of distribution conduits. In some examples, the plurality of distribution conduits are formed in two columns e.g., the first column and the second column. For example, the plurality of distribution conduits includes a first set of distribution conduits and a second set of distribution conduits that are arranged along the two columns. The first set of distribution conduits is arranged along the first column and the second set of distribution conduits is arranged along the second column. In other words, the plurality of distribution conduits includes a first distribution conduit and a second distribution conduit that are arranged along the first column, and a third distribution conduit and a fourth distribution conduit that are arranged along the second column. The first distribution conduit and the second distribution conduit may have a first common head section, and the third distribution conduit and the fourth distribution conduit may have a second common head section.

In some examples, fluidically coupling each distribution conduit formed on the lower surface to the inlet port and the outlet port formed on the first and second sidewalls includes establishing connection between a first orifice of a plurality of first orifices, a second orifice of a plurality of second orifices, a first channel, and a second channel. In some examples, each of the plurality of first and second orifices extend between the lower surface and the upper surface of the second cooling component. Moreover, the first and second channels are formed on the upper surface of the second cooling component. In such examples, one of the inlet port or the outlet port is connected to the plurality of first orifices via the first channel and the other one of the inlet port or the outlet port is connected to the plurality of second orifices via the second channel.

In one or more examples, the second cooling component are formed by a machining process, such as milling, drilling, or molding to form the plurality of first orifices, the plurality of second orifices, the first channel, and the second channel. In some examples, the upper surface of the second cooling component may be machined to form a plurality of second divider walls and a plurality of third divider walls to define the plurality of first channel and the second channel respectively. In some examples, the plurality of first orifices includes two first orifices, e.g., one first orifice and other first orifice, which are positioned adjacent to one another at a mid-region of the second cooling component. The plurality of second orifices includes four second orifices, e.g., one second orifice, other second orifice, yet other second orifice, and yet other second orifice, where each of those four orifices are positioned proximate to four corners of the second cooling component. The method 800 continues to block 810.

At block 810, the method 800 includes disposing the second cooling component on the first cooling component to form a cooling module, such that each distribution conduit of the plurality of distribution conduits is disposed on one or more microchannel blocks of the plurality of microchannel blocks. In some examples, the second cooling component is disposed on the first cooling component such that each distribution conduit is thermally coupled to one or more microchannel blocks and defines a flow path for a flow of coolant between the first and second cooling components. In one or more examples, the one or more microchannel blocks are positioned in the flow path defined by each distribution conduit. For example, a first flow path defined by the first distribution conduit has an "S-shaped" profile and a second flow path defined by the second distribution conduit has an "inverted S-shaped" profile. Similarly, a third flow path defined by the third distribution conduit has the "inverted S-shaped" profile and a fourth flow path defined by the fourth distribution conduit has the "S-shaped" profile. In such examples, each distribution conduit directs a flow of coolant from the inlet port to the outlet port along the flow path, where the coolant passes through the one or more microchannel blocks to absorb the waste heat transferred to the one or more microchannel blocks from at least one chipset of the plurality of chipsets. In some examples, the plurality of chipsets includes a first chip, other first chip, a plurality of second chips, and a plurality of other second chips. In some examples, the first chip may include a CPU, the other first chip may include a GPU chip, and the plurality of second chips may include memory chips. The method 800 ends at block 812.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A cooling module for a circuit module, comprising:
   a first cooling component comprising a plurality of microchannel blocks thermally coupled to a plurality of chipsets of the circuit module, wherein each microchannel block comprises a plurality of elongated fins to define a plurality of microchannels; and
   a second cooling component disposed on the first cooling component, comprising an inlet port, an outlet port, and a plurality of distribution conduits fluidically coupled to the inlet port and the outlet port, wherein each distribution conduit of the plurality of distribution conduits is disposed on one or more microchannel blocks of the plurality of microchannel blocks, and directs a flow of coolant from the inlet port to the outlet port through the plurality of microchannels of the one or more microchannel blocks to absorb waste heat transferred to the one or more microchannel blocks from at least one chipset of the plurality of chipsets, wherein the plurality of distribution conduits comprises a first set of distribution conduits arranged along a first column and a second set of distribution conduits arranged along a second column, and wherein each of the first set of distribution conduits and the second set of distribution conduits defines a serpentine flow path aligned over a portion of a respective chipset of the plurality of chipsets.

2. The cooling module of claim 1, wherein the plurality of distribution conduits is formed on a lower surface of the second cooling component, and wherein the plurality of microchannel blocks is formed on an upper surface of the first cooling component.

3. The cooling module of claim 1, wherein the second cooling component further comprises a plurality of first orifices, a plurality of second orifices, a first channel, and a second channel, wherein one of the inlet port or the outlet port is connected to the plurality of first orifices via the first channel and the other one of the inlet port or the outlet port is connected to the plurality of second orifices via the second channel, and wherein each distribution conduit is fluidically coupled to the inlet port and the outlet port via at least one first orifice, at least one second orifice, the first channel, and the second channel.

4. The cooling module of claim 1, wherein the plurality of chipsets comprises a first chipset arranged along the first column and a second chipset arranged along the second column, and wherein each of the first chipset and the second chipset comprises a first chip and a plurality of second chips.

5. The cooling module of claim 4, wherein the plurality of microchannel blocks comprises a first set of microchannel blocks arranged along the first column and a second set of microchannel blocks arranged along the second column, and wherein each of a plurality of microchannels defined in each microchannel block has a linear flow path.

6. The cooling module of claim 4, wherein each distribution conduit directs the coolant through the one or more microchannel blocks to: i) absorb the waste heat from the portion of the first chip and subsequently absorb the waste heat from the one or more second chips or ii) absorb the waste heat from the one or more second chips and subsequently absorb the waste heat from the portion of the first chip.

7. The cooling module of claim 1, wherein at least one of a height of the plurality of elongated fins, a thickness of the plurality of elongated fins, or a spacing between fins in the plurality of elongated fins of at least one microchannel block is varied to regulate a heat transfer rate between the at least one chipset and the coolant via the at least one microchannel block.

8. The cooling module of claim 1, wherein the coolant is one of a mixture of water and propylene glycol, a dielectric fluid, or a treated water, wherein the cooling module reduces temperature of the plurality of chipsets by about 2.9 degrees Celsius to 11.7 degrees Celsius, and wherein a volumetric flow rate of the coolant between the inlet port and the outlet port of the cooling module is about 0.12 gallons per minute.

9. A circuit assembly comprising:
   a circuit module comprising a substrate and a plurality of chipsets disposed on the substrate; and
   a cooling module comprising:
      a first cooling component comprising a plurality of microchannel blocks thermally coupled to the plurality of chipsets, wherein each microchannel block comprises a plurality of elongated fins to define a plurality of microchannels; and
      a second cooling component disposed on the first cooling component, comprising an inlet port, an outlet port, and a plurality of distribution conduits fluidically coupled to the inlet port and the outlet port, wherein each distribution conduit of the plurality of distribution conduits is disposed on one or more microchannel blocks of the plurality of microchannel blocks and directs a flow of coolant from the inlet port to the outlet port through the plurality of microchannels of the one or more microchannel blocks to absorb waste heat transferred to the one or more microchannel blocks from at least one chipset of the plurality of chipsets, wherein the plurality of distribution conduits comprises a first set of distribution conduits arranged along a first column and a second set of distribution conduits arranged along a second column, and wherein each of the first set of distribution conduits and the second set of distribution conduits defines a serpentine flow path aligned over a portion of a respective chipset of the plurality of chipsets.

10. An electronic device comprising the circuit assembly of claim 9 further including a printed circuit board, wherein the circuit module is removably coupled to the printed circuit board.

11. The circuit assembly of claim 9, wherein the plurality of distribution conduits is formed on a lower surface of the second cooling component, and wherein the plurality of microchannel blocks are formed on an upper surface of the first cooling component.

12. The circuit assembly of claim 9, wherein the second cooling component further comprises a plurality of first orifices, a plurality of second orifices, a first channel, and a second channel, wherein one of the inlet port or the outlet port is connected to the plurality of first orifices via the first channel and the other one of the inlet port or the outlet port is connected to the plurality of second orifices via the second channel, and wherein each distribution conduit is fluidically coupled to the inlet port and the outlet port via at least one first orifice, at least one second orifice, the first channel, and the second channel.

13. The circuit assembly of claim 9, wherein the plurality of chipsets comprises a first chipset arranged along the first column and a second chipset arranged along the second column, and wherein each of the first chipset and the second chipset comprises a first chip and a plurality of second chips.

14. The circuit assembly of claim 13, wherein the plurality of microchannel blocks comprises a first set of microchannel blocks arranged along the first column and a second set of microchannel blocks arranged along the second column, wherein each of a plurality of microchannels defined in each microchannel block has a linear flow path, and wherein each distribution conduit directs the coolant through the one or more microchannel blocks to: i) absorb the waste heat from the portion of the first chip and subsequently absorb the waste heat from the one or more second chips or ii) absorb the waste heat from the one or more second chips and subsequently absorb the waste heat from the portion of the first chip.

15. The circuit assembly of claim 9, wherein at least one of a height of the plurality of elongated fins, a thickness of the plurality of elongated fins, or a spacing between fins in the plurality of elongated fins of at least one microchannel block is varied to regulate a heat transfer rate between the at least one chipset and the coolant via the at least one microchannel block, wherein the coolant is one of a mixture of water and propylene glycol, a dielectric fluid, or a treated water, wherein the cooling module reduces temperature of the plurality of chipsets by about 2.9 degrees Celsius to 11.7 degrees Celsius, and wherein a volumetric flow rate of the coolant between the inlet port and the outlet port of the cooling module is about 0.12 gallons per minute.

\* \* \* \* \*